United States Patent
Kinjo

(10) Patent No.: US 8,014,585 B2
(45) Date of Patent: Sep. 6, 2011

(54) IMAGE PLOTTING DATA OBTAINING METHOD AND APPARATUS, AND IMAGE PLOTTING METHOD AND APPARATUS

(75) Inventor: Naoto Kinjo, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 828 days.

(21) Appl. No.: 12/088,833

(22) PCT Filed: Sep. 21, 2006

(86) PCT No.: PCT/JP2006/318742
§ 371 (c)(1),
(2), (4) Date: Mar. 31, 2008

(87) PCT Pub. No.: WO2007/037165
PCT Pub. Date: Apr. 5, 2007

(65) Prior Publication Data
US 2009/0136119 A1    May 28, 2009

(30) Foreign Application Priority Data
Sep. 29, 2005    (JP) .................................. 2005-283518

(51) Int. Cl.
*G06K 9/00*    (2006.01)
(52) U.S. Cl. .......................... 382/141; 382/144; 382/145
(58) Field of Classification Search ........... 382/141–152
See application file for complete search history.

(56) References Cited

U.S. PATENT DOCUMENTS

| | | | | |
|---|---|---|---|---|
| 4,807,158 A | * | 2/1989 | Blanton et al. | 345/581 |
| 5,022,087 A | * | 6/1991 | Peppers et al. | 382/214 |
| 5,132,723 A | * | 7/1992 | Gelbart | 355/40 |
| 5,442,556 A | * | 8/1995 | Boyes et al. | 701/9 |
| 6,876,494 B2 | * | 4/2005 | Ishikawa et al. | 359/618 |
| 7,339,602 B2 | * | 3/2008 | Shimoyama et al. | 347/238 |
| 2004/0153989 A1 | | 8/2004 | Tange | |
| 2004/0184119 A1 | | 9/2004 | Nakaya et al. | |

FOREIGN PATENT DOCUMENTS

| | | |
|---|---|---|
| JP | 2004233718 A | 8/2004 |
| JP | 2004235487 A | 8/2004 |
| JP | 200543424 A | 2/2005 |
| JP | 2005208297 A | 3/2008 |

* cited by examiner

Primary Examiner — Gregory J Toatley
Assistant Examiner — Jarreas C Underwood
(74) Attorney, Agent, or Firm — Sughrue Mion, PLLC

(57) ABSTRACT

Obtaining hypothetical image plot point trajectories in original image data corresponding to predetermined hypothetical image plotting trajectories on a substrate; obtaining and storing in advance hypothetical image plotting data corresponding to the hypothetical image plot point data trajectories from the original image data; selecting hypothetical image plot point data trajectories corresponding to the image plotting trajectory on the substrate when an image is plotted, and obtaining information indicating the area corresponding to the image plot point data trajectory in each hypothetical image plot point data trajectory indicated by the selected hypothetical image plot point data trajectories; identifying hypothetical image plotting data corresponding to the hypothetical image plotting data trajectories; obtaining partial hypothetical image plotting data based on the information indicating the area corresponding to the image plot point data trajectory; and obtaining image plotting data based on each partial hypothetical image plotting data.

18 Claims, 13 Drawing Sheets

| TRACE DATA NUMBER | START POINT x1 | START POINT y1 | VARIATION AMOUNT Δy |
|---|---|---|---|
| 1 | 0 | 0 | -3 |
| 2 | 0 | 0 | -3 |
| 3 | 0 | 0 | -3 |
| 4 | 0 | 0 | 0 |
| 5 | 0 | 0 | 0 |
| . | . | . | . |
| . | . | . | . |
| 9 | 0 | 1 | +3 |
| 10 | 0 | 1 | +3 |
| 1 | 0 | 1 | +3 |
| . | . | . | . |

FIG.9  TEMPLATE DATA
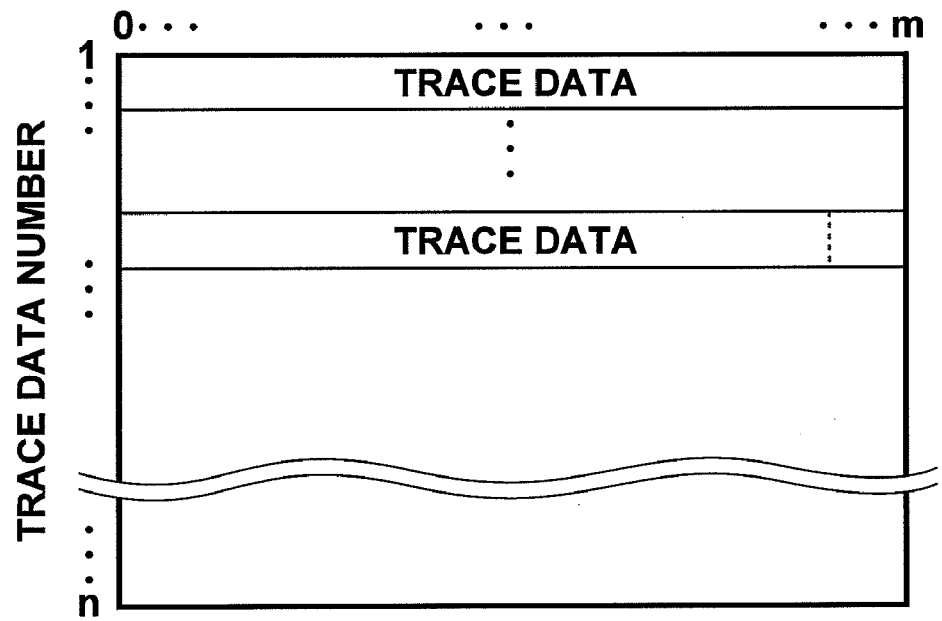
FIG.10
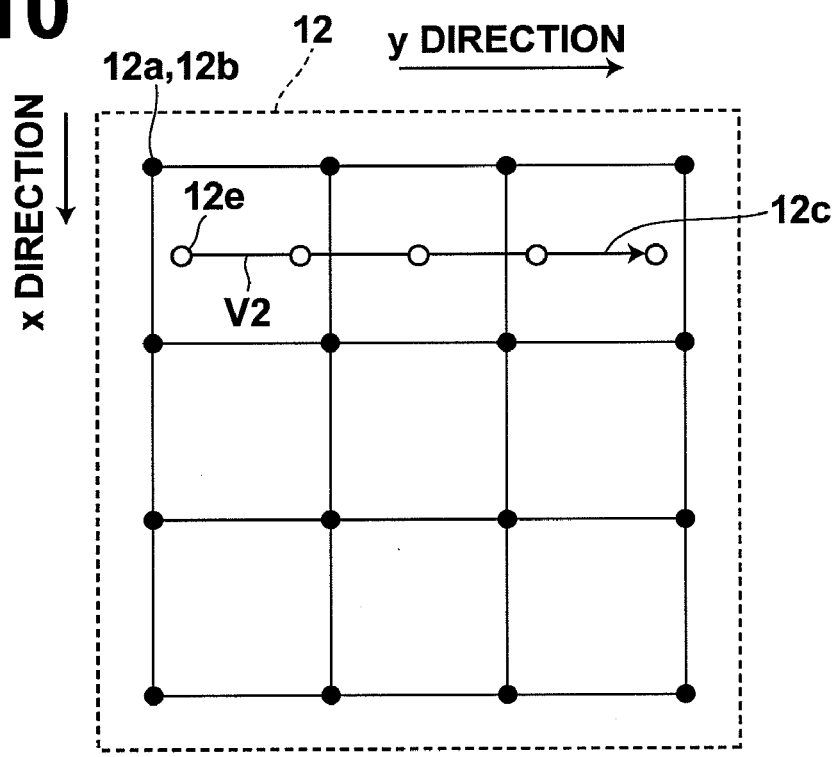

FIG.15

| TRACE DATA NUMBER CORRESPONDING TO LINE i | READOUT POSITION y0 | FLAG 1 | READOUT LENGTH L1 | + |
|---|---|---|---|---|
| TRACE DATA NUMBER CORRESPONDING TO LINE i+1 | READOUT POSITION y1 | FLAG 2 | READOUT LENGTH L2 | + |
| TRACE DATA NUMBER CORRESPONDING TO LINE i+2 | READOUT POSITION y2 | FLAG 3 | READOUT LENGTH L3 | |

FIG.16

| TRACE DATA NUMBER CORRESPONDING TO LINE i | READOUT POSITION y0 | FLAG 1 | READOUT LENGTH L1 | + |
|---|---|---|---|---|

| RELATIVE NUMBER | READOUT POSITION y1 | FLAG 2 | READOUT LENGTH L2 | + |
|---|---|---|---|---|

| RELATIVE NUMBER | READOUT POSITION y2 | FLAG 3 | READOUT LENGTH L3 | |
|---|---|---|---|---|

LCD IMAGE DATA

START POINT

| TRACE DATA NUMBER | START ADDRESS |
|---|---|
| 1 | 0X000000 |
| 2 | 0XAAAAAA |
| 3 | 0XBBBBBB |
| 4 | . |
| 5 | . |
| . | . |
| . | . |
| 9 | . |
| 10 | . |
| 11 | . |
| . | . |

IMAGE PLOTTING DATA OBTAINING METHOD AND APPARATUS, AND IMAGE PLOTTING METHOD AND APPARATUS

TECHNICAL FIELD

The present invention relates to an image plotting data obtaining method and apparatus for obtaining image plotting data used when plotting an image on a substrate. The invention also relates to an image plotting method and apparatus for plotting an image on a substrate based on the image plotting data obtained by the image plotting data obtaining method and apparatus.

BACKGROUND ART

Various types of exposure systems using photolithography techniques are proposed as systems for recording predetermined patterns on printed circuit boards or on substrates of flat panel displays such as liquid crystal displays.

As one of such exposure systems described above, for example, an exposure system that scans a light beam on a substrate with a photoresist applied thereon in the main scanning and sub-scanning directions while modulating the light beam with exposure image data representing an exposure pattern to form the exposure pattern on the substrate is proposed.

As such exposure systems, various types of exposure systems that use, for example, a spatial light modulation device, such as digital micro-mirror device (DMD) or the like, are proposed, in which exposure is performed by modulating the light beam with the spatial modulation device according to image data.

As one of such exposure systems employing the DMD described above, an exposure system for forming a desired image on an exposure surface by moving the DMD in a predetermined scanning direction relative to the exposure surface, and inputting image plotting data corresponding to multitudes of micro-mirrors to the memory cells of the DMD according to the movement of the DMD in the scanning direction to sequentially form image plot points corresponding to the micro-mirrors of the DMD in time series manner is proposed as described, for example, in Japanese Unexamined Patent Publication No. 2004-233718.

Here, it is assumed, for example, the case where exposure patterns are formed on a multi-layer printed circuit board. The multi-layer printed circuit board is heated in pressing process to paste the respective layers together and the board may sometimes be deformed by the heat. Thus, in order to accurately align the exposure patterns on the respective layers, it is necessary to form the exposure pattern on each layer by taking into account the deformation of the board.

Also, for flat panel displays, the substrate is heated when color filter patters are exposed, so that the substrate may be stretched or shortened by the heat and the recording position of each color of R G B may be displaced. Therefore, it is necessary to form an exposure pattern by taking into account the deformation of the substrate.

In the case where the same exposure pattern is formed on many substrates or the like, if exposure image data are generated in real time according to the amount of deformation of each substrate, and the exposure is performed based on the exposure image data, the production efficiency may be reduced due to prolonged time required for generating the exposure image data according to the amount of deformation of each substrate.

Consequently, a method for obtaining exposure image data without decreasing the production efficiency is conceivable, in which deformations of the substrates described above are assumed, then a plurality of different types of exposure image data is generated in advance by an image processing unit according to the deformations of the substrates and stored in an exposure unit, and when an exposure is actually performed, information related to the amount of deformation of a substrate is obtained and the exposure image data corresponding to the amount of deformation of the substrate are read out and used for the exposure.

The present invention relates to improvements in the method and apparatus for obtaining image plotting data used for the aforementioned image plotting method and apparatus.

DISCLOSURE OF THE INVENTION

The image plotting data obtaining method of the present invention is a method for obtaining image plotting data used when plotting an image on a substrate by moving an image plot point forming area, which forms an image plot point based on the image plotting data, relative to the substrate and sequentially forming the image plot points on the substrate according to the movement, the method including the steps of:

associating information of a plurality of predetermined hypothetical image plotting trajectories of the image plot point forming area on the substrate, the trajectories having different start point positions from each other in the direction orthogonal to the relative moving direction, with original image data representing the image, and obtaining information of a plurality of hypothetical image plot point data trajectories in the original image data, each corresponding to each of the plurality of hypothetical image plotting trajectories;

obtaining hypothetical image plotting data, each corresponding to each of the hypothetical image plot point data trajectories, from the original image data based on the information of plurality of hypothetical image plot point data trajectories;

storing the obtained plurality of hypothetical image plotting data in advance, and setting a correspondence relationship between the hypothetical image plot point data trajectories and the hypothetical image plotting data in advance;

obtaining information of image plotting trajectory of the image plot point forming area on the substrate when the image is plotted;

associating the obtained image plotting trajectory with the original image data, and obtaining information of image plot point data trajectory of the image plot point forming area in the original image data corresponding to the image plotting trajectory;

selecting a plurality of hypothetical image plot point data trajectories corresponding to the obtained image plot point data trajectory from the plurality of hypothetical image plot point data trajectories, and obtaining information indicating the area corresponding to the image plot point data trajectory in each hypothetical image plot point data trajectory indicated by the selected hypothetical image plot point data trajectories;

identifying hypothetical image plotting data corresponding to the selected plurality of hypothetical image plot point data trajectories from the plurality of hypothetical image plotting data stored in advance based on the correspondence relationship;

obtaining partial hypothetical image plotting data from each of the identified hypothetical image plotting data based on the information indicating the area corresponding to the image plot point data trajectory; and obtaining image plotting data corresponding to the image plot point data trajectory based on each of the obtained partial hypothetical image plotting data.

In the image plotting data obtaining method of the present invention, as the plurality of hypothetical image plotting trajectories, only those parallel to the relative moving direction may be set.

Further, the plurality of hypothetical image plotting trajectories may be set with a quantization coarser than that of the image plotting trajectory on the substrate.

Still further, if the image plotting trajectory is obtained by a curved line or a polygonal line, the method may include the following steps:

obtaining the image plot point data trajectory as a plurality of partial image plot point data trajectories corresponding to the curved line or polygonal line;

performing the selection of a plurality of hypothetical image plot point data trajectories with respect to each of the obtained partial image plot point data trajectories, and obtaining information indicating the area corresponding to each of the partial image plot point data trajectories in each hypothetical image plot point data trajectory indicated by the selected hypothetical image plot point data trajectories;

identifying hypothetical image plotting data corresponding to the selected plurality of hypothetical image plotting data trajectories from the plurality of hypothetical image plotting data stored in advance based on the correspondence relationship;

obtaining partial hypothetical image plotting data from each of the identified hypothetical image plotting data based on the information indicating the area corresponding to each of the partial image plot point data trajectories;

obtaining image plotting data corresponding to each of the partial image plot point data trajectories based on each of the obtained partial hypothetical image plotting data; and obtaining image plotting data corresponding to the image plot point data trajectory based on the obtained image plotting data of each of the partial image plot point data trajectories.

The image plotting method of the present invention is a method including the steps of:

obtaining image plotting data using the image plotting data obtaining method described above; and plotting an image on a substrate based on the obtained image plotting data.

The image plotting data obtaining apparatus of the present invention is an apparatus for obtaining image plotting data used when plotting an image on a substrate by moving an image plot point forming area, which forms an image plot point based on the image plotting data, relative to the substrate and sequentially forming the image plot points on the substrate according to the movement, the apparatus including:

a hypothetical image plot point data trajectory information obtaining unit for associating information of a plurality of predetermined hypothetical image plotting trajectories of the image plot point forming area on the substrate, the trajectories having different start point positions from each other in the direction orthogonal to the relative moving direction, with original image data representing the image, and obtaining information of a plurality of hypothetical image plot point data trajectories in the original image data, each corresponding to each of the plurality of hypothetical image plotting trajectories;

a hypothetical image plotting data obtaining unit for obtaining hypothetical image plotting data, each corresponding to each of the hypothetical image plot point data trajectories, from the original image data based on the information of plurality of hypothetical image plot point data trajectories obtained by the hypothetical image plot point data trajectory information obtaining unit;

a hypothetical image plotting data storage unit for storing, in advance, the plurality of hypothetical image plotting data obtained by the hypothetical image plotting data obtaining unit;

a correspondence relationship setting unit in which the correspondence relationship between the hypothetical image plot point data trajectories and the hypothetical image plotting data is set in advance;

an image plotting trajectory information obtaining unit for obtaining information of image plotting trajectory of the image plot point forming area on the substrate when the image is plotted;

an image plot point data trajectory information obtaining unit for associating the image plotting trajectory obtained by the image plotting trajectory information obtaining unit with the original image data, and obtaining information of image plot point data trajectory of the image plot point forming area in the original image data corresponding to the image plotting trajectory;

a hypothetical image plot point data trajectory selection unit for selecting a plurality of hypothetical image plot point data trajectories corresponding to the image plot point data trajectory obtained by the image plot point data trajectory information obtaining unit from the plurality of hypothetical image plot point data trajectories obtained by the hypothetical image plot point data trajectory information obtaining unit, and obtaining information indicating the area corresponding to the image plot point data trajectory in each hypothetical image plot point data trajectory indicated by the selected hypothetical image plot point data trajectories; and an image plotting data obtaining unit for identifying hypothetical image plotting data corresponding to the plurality of hypothetical image plotting data trajectories selected by the hypothetical image plot point data trajectory selection unit from the plurality of hypothetical image plotting data stored in advance based on the correspondence relationship, obtaining partial hypothetical image plotting data from each of the identified hypothetical image plotting data based on the information indicating the area corresponding to the image plot point data trajectory, and obtaining image plotting data corresponding to the image plot point data trajectory based on each of the obtained partial hypothetical image plotting data.

In the image plotting data obtaining apparatus of the present invention, as the plurality of hypothetical image plotting trajectories, only those parallel to the relative moving direction may be set.

Further, the plurality of hypothetical image plotting trajectories may be set with a quantization width coarser than that of the image plotting trajectory on the substrate.

Still further, the image plotting trajectory information obtaining unit may be a unit for obtaining the image plotting trajectory by a curved line or a polygonal line; the image plot point data trajectory information obtaining unit may be a unit for obtaining the image plot point data trajectory as a plurality of partial image plot point data trajectories corresponding to the curved line or polygonal line; the hypothetical image plot point data trajectory selection unit may be a unit for selecting a plurality of hypothetical image plot point data trajectories with respect to each of the partial image plot point data trajectories obtained by the image plot point data trajectory information obtaining unit, and obtaining information indicating the area corresponding to each of the partial image plot point data trajectories in each hypothetical image plot point data trajectory indicated by the selected hypothetical image plot point data trajectories; and the image plotting data obtaining unit may be a unit for identifying hypothetical image plotting data corresponding to the plurality of hypothetical image plotting data trajectories selected by the hypothetical image plot point data trajectory selection unit from the plurality of hypothetical image plotting data stored in advance based on the correspondence relationship, obtaining partial hypothetical image plotting data from each of the identified hypothetical image plotting data based on the information indicating the area corresponding to each of the partial image plot point data trajectories, and obtaining image plotting data corresponding to each of the partial image plot point data trajectories based on each of the obtained partial hypothetical image plotting data.

The image plotting apparatus of the present invention includes:

the image plotting data obtaining apparatus described above; and an image plotting means for plotting an image on a substrate based on image data obtained by the image plotting data obtaining apparatus.

The term "image plot point forming area" as used herein may be any area formed by any means as long as it is an area for forming an image plot point on a substrate. For example, it may be a beam spot formed by a light beam reflected by each modulation element of a spatial modulation device, such as DMD or formed by a light beam itself emitted from a light source, or it may be an area where an ink discharged from each nozzle is to be attached.

The present invention may be a method and apparatus that performs the following when each individual image plotting operation is performed on an image plotting surface by the image plot point forming area: selecting, from a plurality of hypothetical image plotting data sets provided in advance based on a plurality of presumable positional relationships between the image plotting forming area and image plotting surface, at least two specific hypothetical image plotting data sets based on the actual positional relationship between them; extracting a portion corresponding to the actual positional relationship between the image plotting forming area and image plotting surface from each of the at least two specific hypothetical image plotting data sets; and obtaining image plotting data for the image plotting operation by combining the data of the extracted portions. In this case, each hypothetical data set may be a group of data given to the image plot point forming area in a time series or a group of data given to a grouped plurality of image plot point forming areas simultaneously.

According to the image plotting data obtaining method and apparatus, the following are performed: storing hypothetical image plotting data obtained based on the information of hypothetical image plot point trajectories different from each other in advance; obtaining information of image plot point data trajectories corresponding to the image plotting trajectory of the image plot point forming area on the substrate when the image is plotted; selecting a plurality of hypothetical image plot point data trajectories corresponding to the obtained image plot point data trajectory, and obtaining information indicating the area corresponding to the image plot point data trajectory in each hypothetical image plot point data trajectory indicated by the selected hypothetical image plot point data trajectories; identifying hypothetical image plotting data corresponding to the selected plurality of hypothetical image plotting data trajectories; obtaining partial hypothetical image plotting data from each of the identified hypothetical image plotting data based on the information indicating the area corresponding to the image plot point data trajectory; and obtaining image plotting data corresponding to the image plot point data trajectory based on each of the obtained partial hypothetical image plotting data. This allows image plotting data according to deformation of the substrate, and the like to be obtained without reducing the production efficiency.

Further, as described above, a plurality of hypothetical image plot point data trajectories is selected with respect to a single image plot point data trajectory, and image plotting data corresponding to the image plot point data trajectory is obtained by combining the plurality of hypothetical image plot point data trajectories. This allows, for example, approximation of the image plot point data trajectory to be made using a plurality of hypothetical image plot point data trajectories having a smaller inclination than that of the image plot point data trajectory. This eliminates the need to set hypothetical image plot point data trajectories corresponding to the image plot point data trajectory having a larger inclination, so that the number of hypothetical image plot point data trajectories may be reduced, thus resulting in a reduced hypothetical image plotting data volume.

The image plotting method and apparatus of the present invention may provide identical effects to those described above.

BRIEF DESCRIPTION OF THE DRAWINGS

FIG. 9 illustrates a template data.

FIG. 10 is a schematic view illustrating the relationship between reference marks on a substrate having an ideal shape and passage position information of a predetermined micro-mirror.

FIG. 15 illustrates an example data structure of exposure point data information.

FIG. 16 illustrates an example data structure of exposure point data information.

BEST MODE FOR CARRYING OUT THE INVENTION

Figure 1:
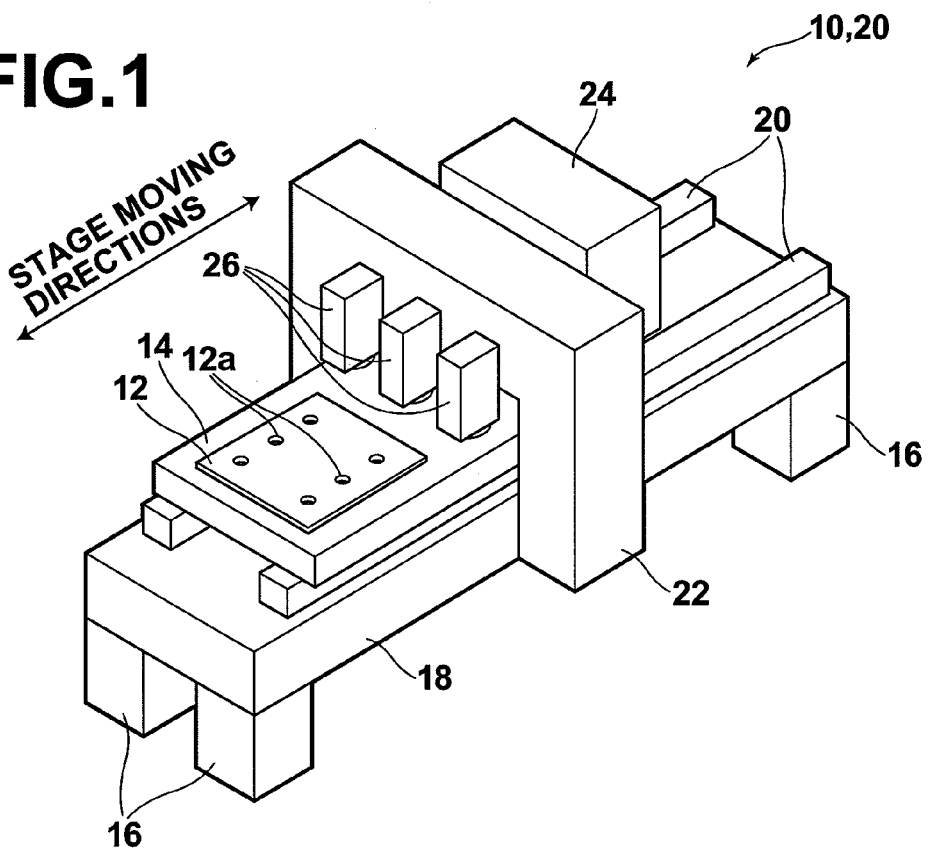
FIG. 1 is a perspective view of an exposure apparatus that employs an embodiment of the image plotting method and apparatus of the present invention, illustrating the schematic structure thereof.

Hereinafter, an exposure apparatus employing a first embodiment of the image plotting data obtaining method and apparatus, and image plotting method and apparatus of the present invention will be described in detail with reference to the accompanying drawings. FIG. 1 is a perspective view of the exposure apparatus, illustrating the structure thereof. The exposure apparatus is an apparatus for exposing a predetermined exposure pattern, and has characteristic features, in particular, in the method for generating exposure image data used for exposing the exposure pattern. But, the overall structure of the exposure apparatus of the present embodiment will be described first.

As illustrated in FIG. 1, the exposure apparatus 10 includes a plate-like moving stage 14 for holding a substrate 12 thereon by suction. Two guides 20 extending along the moving direction of the stage are provided on the upper surface of a thick plate-like mounting platform 18 which is supported by four legs 16. The stage 14 is arranged such that its longitudinal direction is oriented to the moving direction of the stage, and movably supported by the guides 20 to allow back-and-forth movements.

An inverse U-shaped gate 22 striding over the moving path of the moving stage 14 is provided at the central part of the mounting platform 18. Each of the ends of the inverse U-shaped gate 22 is fixedly attached to each of the sides of the mounting platform 18. A scanner 24 is provided on one side of the gate 22, and a plurality of cameras 26 is provided on the other side for detecting the front and rear ends of the substrate 12 and positions of a plurality of circular reference marks 12a provided on the substrate 12 in advance.

Each of the reference marks 12a provided on the substrate 12 is, for example, a pore formed in advance based on predetermined reference mark position information. It is noted that land, via or etched mark may be used other than the pore. Alternatively, a predetermined pattern formed on the substrate 12, for example, a pattern on the lower layer of a layer on which an exposure is to be performed may be used as the reference marks 12a. Although only six reference marks are indicated in FIG. 1, in fact, however, multitudes of reference marks 12a are provided.

The scanner 24 and cameras 26 are fixedly attached to the gate 22 over the moving path of the stage 14. The scanner 24 and cameras 26 are connected to a controller that controls them, which will be described later.

Figure 2:
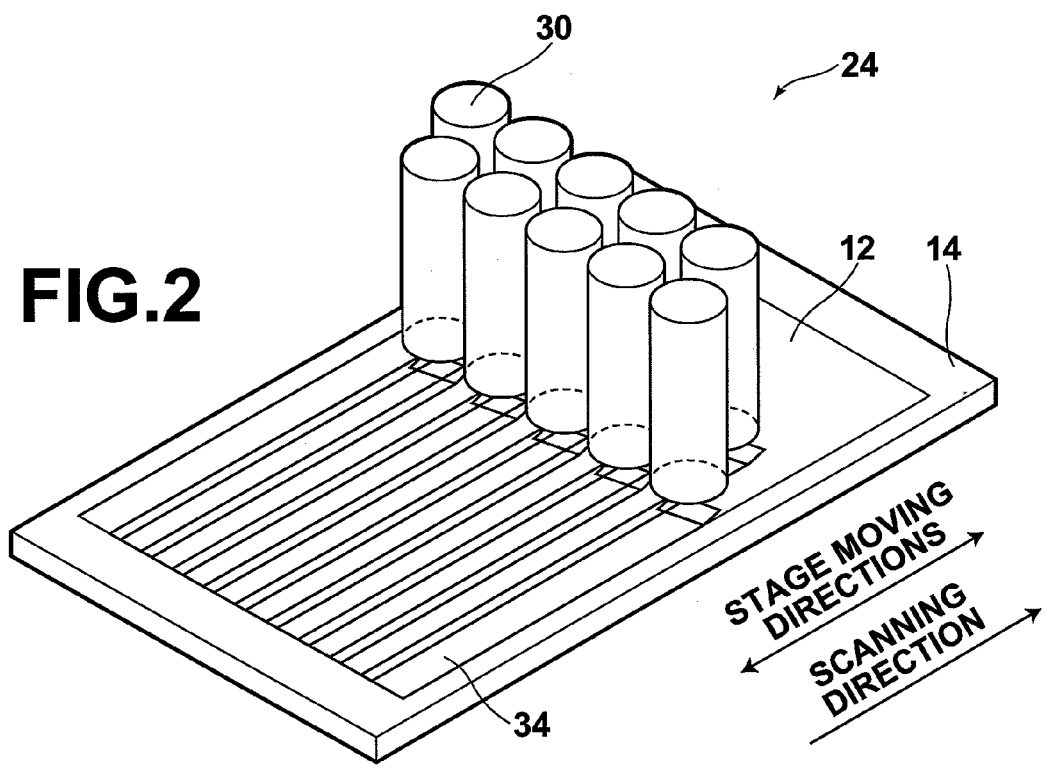
FIG. 2 is a perspective view of a scanner of the exposure apparatus shown in FIG. 1, illustrating the structure thereof.
Figure 3A:
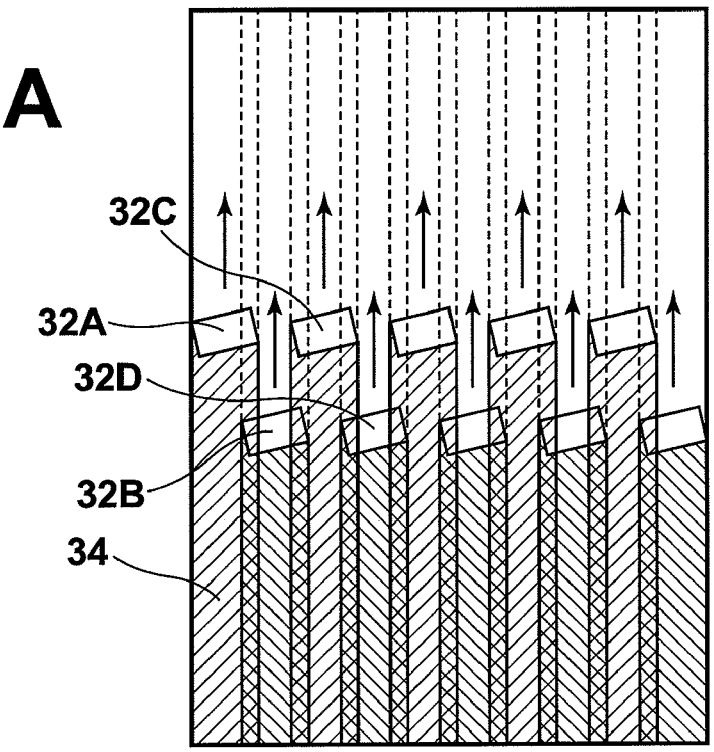
FIG. 3A is a plan view illustrating exposed regions formed on the exposure surface of a substrate.
Figure 3B:
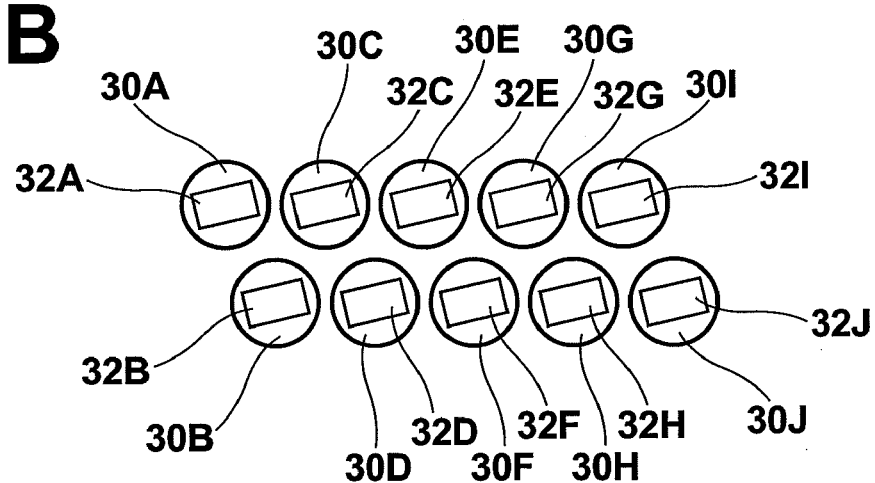
FIG. 3B is a plan view illustrating the arrangement of exposing areas of respective exposing heads.

As shown in FIGS. 2 and 3B, the scanner 24 has ten exposing heads 30 (30A to 30J) disposed in substantially a matrix form of two rows with five columns.

Each exposing head 30 includes a spatial light modulation device (SLM) of digital micro-mirror device (DMD) 36. The DMD 36 includes multitudes of micro-mirrors 38 disposed two-dimensionally in the orthogonal directions, which is attached such that the arrangement direction of the micro-mirror arrays forms a predetermined angle with the scanning direction. Accordingly, the exposing area 32 of each of the exposing heads 30 has a rectangular shape which is inclined with respect to the scanning direction. As illustrated in FIG. 3A, a strip-like exposed region 34 is formed on the substrate 12 by each of the exposing heads 30 as the stage 14 moves. Although a light source for inputting a light beam to each of the exposure heads 30 is omitted in the drawings, but, for example, a laser light source may be used.

Figure 4:
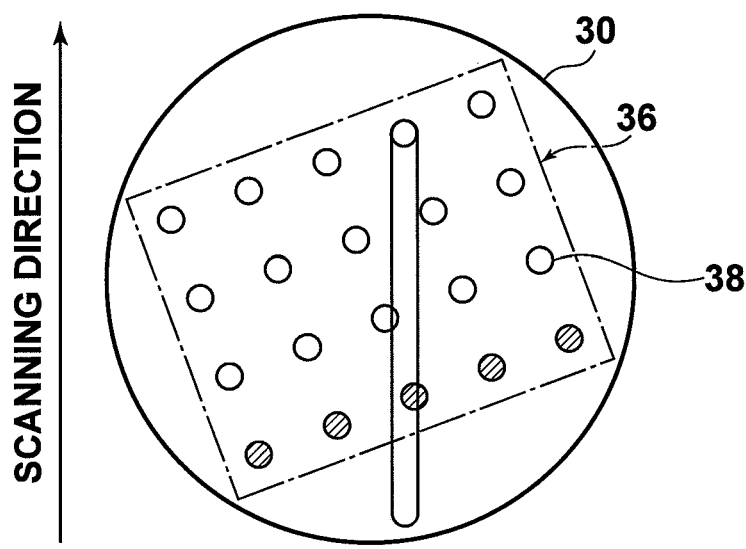
FIG. 4 illustrates a DMD of the exposure head of the exposure apparatus shown in FIG. 1.

The DMD 36 provided in each of the exposure heads 30 is ON/OFF controlled with respect to each of the micro-mirrors 38, and a dot pattern (black and white) corresponding to the micro-mirrors 38 of the DMD 36 is exposed on the substrate 12. The strip-like exposed region 34 described above is formed by two-dimensionally arranged dots corresponding to the micro-mirrors illustrated in FIG. 4. The inclination of the two-dimensionally arranged dot pattern with respect to the scanning direction allows dots arranged in the scanning direction to pass through between dots arranged in the direction orthogonal to the scanning direction, thereby the resolution may be increased. It is noted that there may be the case where some of the dots are not used due to variations in the adjustment of the inclination angle. In FIG. 4, the slashed dots are not used and the micro-mirrors of the DMD 36 corresponding to these dots are always in OFF state.

As illustrated in FIGS. 3A and 3B, each of the exposing heads 30 arranged linearly in each row is displaced by a predetermined distance in the arrangement direction such that each of the stripe-shaped exposed regions 34 partly overlaps with the adjacent exposed regions 34. Consequently, for example, the non-exposable portion between the leftmost exposure area 32A in the first row and the exposure area 32C on the immediate right of the exposure area 32A is exposed by the leftmost exposure area 32B in the second row.

The electrical configuration of the exposure apparatus 10 will now be described.

Figure 5:
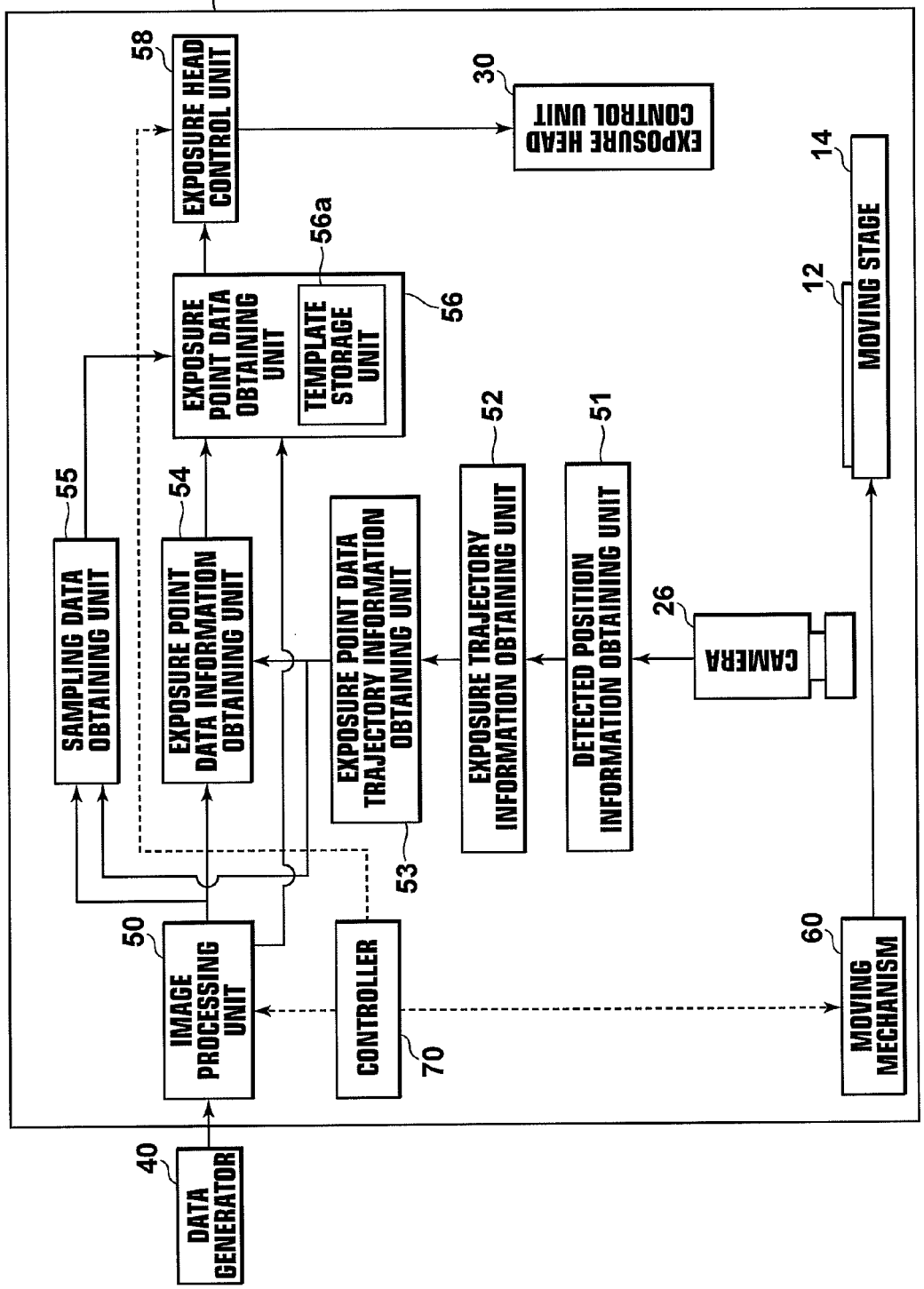
FIG. 5 is a block diagram of the exposure apparatus that employs a first embodiment of the present invention, illustrating the electrical configuration thereof.

As illustrated in FIG. 5, the exposure apparatus 10 includes: an image processing unit 50 for receiving vector data representing an exposure pattern to be exposed outputted from a data generator 40 having a CAM (Computer Aided Manufacturing) station, and performing predetermined processing on the vector data; a detected position information obtaining unit 51 for obtaining detected position information of the reference marks 12a based on an image of the reference marks 12a obtained by the camera 26; an exposure trajectory information obtaining unit 52 for obtaining an exposure trajectory with respect to each micro-mirror 38 on the substrate 12 in an actual exposure based on the detected position information obtained by the detected position information obtaining unit 51; an exposure point data trajectory information obtaining unit 53 for obtaining exposure point data trajectory information in a coordinate system of the exposure image data based on the exposure trajectory information of each micro-mirror 38 obtained by the exposure trajectory information obtaining unit 52; an exposure point data information obtaining unit 54 for obtaining exposure point data information, to be described later, based on the exposure point data trajectory information obtained by the exposure point data trajectory information obtaining unit 53; a sampling data obtaining unit 55 for sampling exposure point data with respect to each micro-mirror 38 from wiring section data, to be described later, based on the exposure point data trajectory information obtained by the exposure point data trajectory information obtaining unit 53; an exposure point data obtaining unit 56 for obtaining exposure point data with respect to each micro-mirror 38 from display section data, to be described later, based on the exposure point data information obtained by the exposure point data information obtaining unit 54; an exposure head control unit 58 for generating a control signal to be supplied to each micro-mirror based on the exposure point data obtained by the exposure point data obtaining unit 56, and outputting the control signal to each exposure head 30; and a controller 70 for performing overall control of the exposure apparatus.

The exposure apparatus 10 further includes a moving mechanism 60 for moving the moving state 14 in the stage moving direction. The moving mechanism 60 may have any know structure as long as it is capable of moving the moving stage 14 reciprocally along the guides 20.

The operation of each of the components will be described in detail later.

Next, the operation of the exposure apparatus 10 will be described with reference to the accompanying drawings.

The exposure apparatus 10 is an apparatus that forms a desired exposure pattern on a substrate 12 by sequentially outputting control signals from the exposure head control unit 58 to the exposure heads 30 while moving the substrate 12 placed on the moving stage 14 in the stage moving direction, and sequentially forming exposure points on the substrate 12.

Further, the exposure apparatus 10 is an apparatus that forms an exposure pattern on a substrate 12 by selecting predetermined trace data from template data stored in the exposure point data obtaining unit 56 in advance, obtaining an exposure point data string with respect to each micro-mirror 38 based on the selected trace data, and outputting a control signal from the exposure head control unit 58 to each micro-mirror 38 of each exposure head 30 based on the obtained exposure point data string.

The template data stored in the exposure point data obtaining unit 56 and a generation method therefor will be described first.

[Template Data Generation Method]

Figure 6:
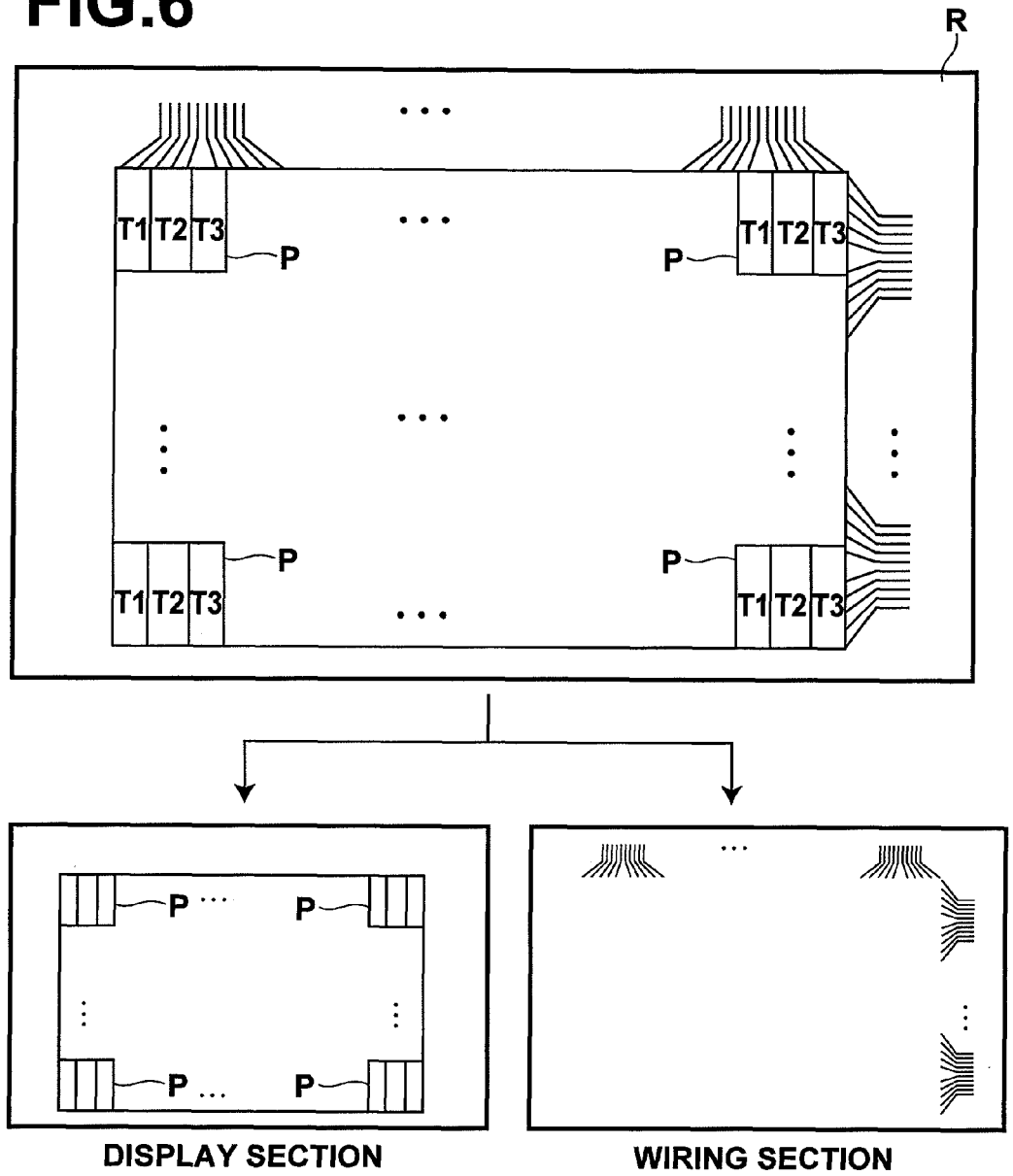
FIG. 6 illustrates an exposure pattern of a liquid crystal display.

Initially, vector data representing an exposure pattern to be exposed on a substrate 12 is generated in the data generation unit 10. It is noted that, in the present embodiment, vector data representing an exposure pattern of a liquid crystal display is generated. As illustrated in FIG. 6, the exposure pattern of the liquid crystal display includes a display section where multitudes of LCD pixels P, formed of three TFTs for representing (r, g, b), are disposed two dimensionally in the orthogonal directions, and a wiring section of wires connected to the display section. In FIG. 6, the TFT for representing "r" is indicated by T1, the TFT for representing "g" is indicated by T2, the TFT for representing "b" is indicated by T3, and the wiring section is indicated by solid lines. In the data generation unit 40, vector data representing the exposure pattern R illustrated in FIG. 6 are generated.

Then, the vector data generated in the data generation unit 40 are outputted to the image processing unit 50. In the image processing unit 50, the vector data are separated into display section data representing the display section data representing the display section and wiring section data representing the wiring section. Thereafter, the display section data and wiring section data are converted to raster data and stored tentatively.

Then, template data are generated with respect to the display data stored tentatively in the manner as described above. It is noted that, in the present embodiment, template data with respect to the wiring section data are not generated. But, a method for obtaining exposure point data from the wiring section data will be described later.

Figures 7, 8:
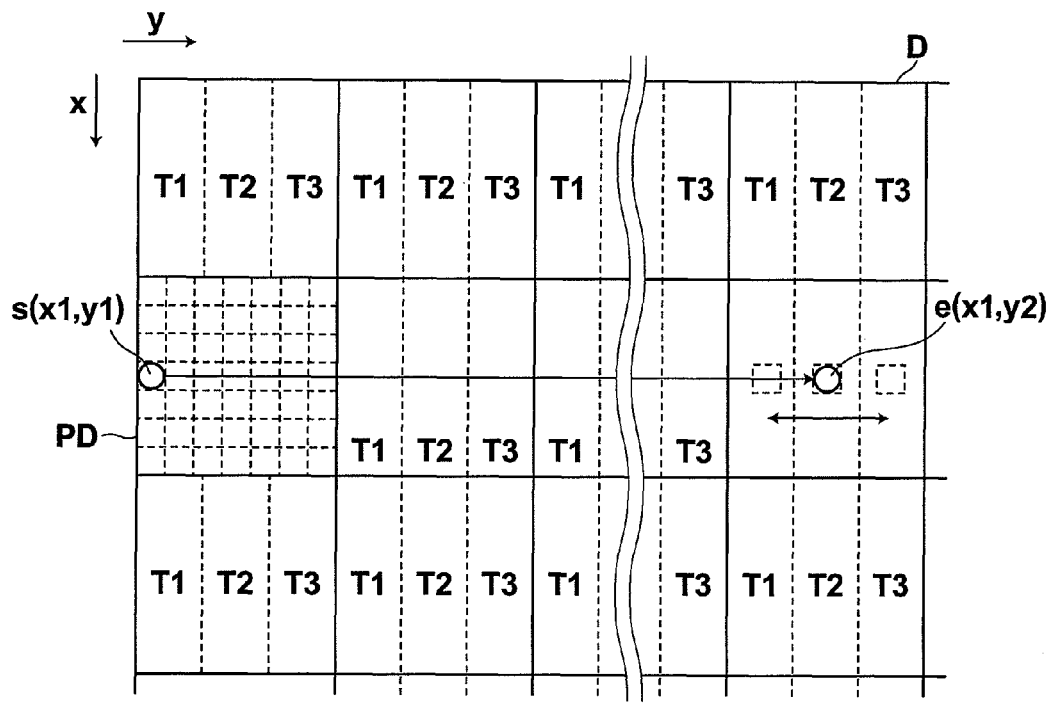
FIG. 7 illustrates a method for generating trace data.
FIG. 8 illustrates the correspondence relationship between a vector V1 (hypothetical image plot point data trajectory information) and trace data.

As illustrated in FIG. 7, in the image processing unit 50, the LCD pixel data PD in the display section data D and coordinates of the exposure point on the substrate exposed by each micro-mirror 38 are associated with each other, and a vector V1 connecting from a predetermined start point s(x1, y1) to an end point e(x1, y2) is set, and LCD pixel data on an extended vector V1t of the vector V1 are sampled at a predetermined sampling pitch to obtain a partial exposure point data string. It is noted that the "y" direction in FIG. 7 corresponds to the scanning direction of the micro-mirrors 38 with respect to the substrate 12, and "x" direction corresponds to the direction orthogonal to the scanning direction. That is, the vector V1 is a part of the trajectory of an image of the micro-mirrors 38 passable across the substrate 12.

More specifically, as illustrated in FIG. 7, a reference vector V1 having a predetermined length L0 in the "y" direction is set for one start point "s" within one LCD pixel data, and LCD pixel data PD on an extended vector V1t of the reference vector V1 are sampled at a sampling pitch, pitch_y0. Further, a vector V1 connecting the start point "s" of the reference vector V1 and each of a plurality of end points "e" located within a variation range W centered on the end point "e" of the reference vector in the "y" direction is set. Then, LCD pixel data PD on an extended vector V1t of each set vector V1 are sampled at a sampling pitch, pitch_y to obtain a partial exposure point data string with respect to each vector V1t. In the present embodiment, it is assumed that only the vectors parallel to the "y" direction is set as vectors V1. The size of the variation range W is predetermined according to the deformation degree of the substrate 12.

The relationship among the length L0 of the reference vector V1, number of sampled exposure point data N, sampling pitch pitch_y0, variation width Δy in the "y" direction, and sampling pitch pitch_y in the "y" direction for the vectors V1 other than the reference vector is as shown in the following.

$$L0 = N \times \text{pitch\_}y0 \quad (1)$$

$$\Delta y = y2 - (y1 + L0) \quad (2)$$

$$\text{pitch\_}y = \text{pitch\_}y0 \times (L0 + \Delta y)/L0 \quad (3)$$

More specifically, for example, N=4096, and pitch_y0=0.75 μm, or the like.

The "extended vector V1t" as used herein means a vector with the end point e(x1, y2) of the vector V1 extended to the end point side of the vector V1, which may be expressed by the following relationship.

$$V1t = V1 \times (1 + k) \quad (4)$$

where k is preferable to be equal to (LCD pixel data size in the "y" direction+marginα)/L0 (5)

It is noted, however, that the condition k>0 is not essential, and k=0 (i.e., V1t=V1) is allowable.

The position of each of the exposure points within one LCD pixel data PD is used as the start point "s", and for each start point "s", vectors V1 connecting the start point "s" and end points "e" located within the predetermined variation range W are set in the manner as described above, and a partial exposure point data string is obtained for the extended vector V1t of each of the vectors V1. Hereinafter, the partial exposure point data string will be referred to as "trace data".

Thereafter, as illustrated in FIG. 8, the trace data number is given to each combination of the coordinates (x1, y1) of each start point "s" in one LCD pixel data PD and a variation amount Δy of each of the end points "e" connected to the start point "s". The "variation amount Δy" as used herein means an amount of displacement of each of the end points "e" within the variation range W in the "y" direction with reference to the end point "e" of the reference vector. Accordingly, the variation amount Δy of the end point "e" of the reference vector is "0".

For the trace data obtained with respect to the respective vectors V1 in the manner as described above, a comparison may be made to see if there are vectors V1 with all of the exposure point data corresponding to each other. If that is the case, the trace data thereof may be treated as common trace data and the same trace data number may be given to them.

In the present embodiment, the start point "s" and end point "e" is connected by a straight line, but they may be connected by a curved line or a polygonal line.

Further, in the present embodiment, the exposure point data corresponding to the vector V1 are obtained from the rasterized display section data D, but the display section data D are not necessarily be rasterized and the exposure point data corresponding to the vector V1 may be obtained from the display section data in the form of vector data.

Still further, in the present embodiment, only the vectors V1 parallel to the "y" direction are set as described above, and trace data corresponding to the vectors V1 are stored in advance, but the end points "e" of the vectors V1 may be varied in the "x" direction. Then, trace data for each of the vectors V1 are obtained in the manner as described above, and the trace data number may be given according to a variation amount Δx of the end point "e" in the "x" direction. The variation amount Δx in the "x" direction is preset according to the deformation degree of the substrate 12, and is desirable to be a smaller amount than a predictable degree of deformation of the substrate. By setting the vectors V1 in the manner as described above, the number of vectors V1 may be reduced, resulting in a reduced trace data volume.

Further, in the present embodiment, the quantization width of the vector V1 is set equal to that of the exposure points actually exposed on the substrate, i.e., that of the exposure trajectory of each micro-mirror 38 on the substrate 12 when the exposure is actually performed. But the quantization width of the vector V1 may be set coarser. For example, in the present embodiment, the position of each exposure point within one set of LCD pixel data PD is set as the start point "s" in FIG. 7, the start points "s" may be set in every other exposure point row in the "x" direction. Also, for the "y" direction, the start points "s" may be set in every other exposure point column. Further, the quantization width of the variation width of the end point "e" in the "y" direction may be set coarser than that of the exposure trajectory. Where the endpoint "e" is varied in the "x" direction, the quantization width of the variation width in the "x" direction may be set coarser than that of the exposure trajectory.

The coarse setting of the quantization width allows the number of vectors V1, so that the trace data volume may be reduced.

[Acquisition of Exposure Data Information]

The template data stored in the template storage unit 56a in the manner as described above are read out based on the exposure point data information obtained by the exposure point data information obtaining unit 54 and outputted to the exposure head control unit 58. Next, acquisition of the exposure point data information in the exposure point data information obtaining unit 54 will be described.

Initially, a control signal is outputted from the controller 70 to the moving mechanism 60, which, in response to the control signal, moves the moving stage 14 to a predetermined initial position located upstream side from the position illustrated in FIG. 1 along the guides 20, and then it moves the moving stage 14 toward downstream side at a desired speed. The term "upstream side" as used herein means the right side in FIG. 1, i.e., the side where the scanner 24 is disposed with respect to the gate 22, and the "downstream side" as used herein means the left side in FIG. 1, i.e., the side where the cameras 26 are disposed with respect to the gage 22.

When the substrate 12 placed on the moving stage 14 moving in the manner as described above passes under a plurality of cameras 26, the substrate 12 is photographed by these cameras, and photographed image data representing the photographed image are inputted to the detected position information obtaining unit 51. The detected position information obtaining unit 51 obtains detected position information representing the positions of the reference marks 12a of the substrate 12 based on the inputted photographed image data. One method for obtaining detected position information of the reference marks 12a is, for example, a method that obtains circular images, but any other known acquisition method may be employed. More specifically, the detected position information of the reference marks 12a are obtained as coordinate values, and the coordinate system thereof is the same as that of the exposure points exposed by the respect micro-mirrors 38.

Then, the detected position information of the reference marks 12a obtained in the manner as described above is outputted from the detected position information obtaining unit 51 to the exposure trajectory information obtaining unit 52.

In the exposure trajectory information obtaining unit 52, information of the exposure trajectory on the substrate 12 with respect to each micro-mirror 38 in an actual exposure is obtained based on the inputted detected position information. More specifically, passage position information indicating the position where the image of each micro-mirror 38 of the DMD 36 of each exposure head 30 passes is preset with respect to each micro-mirror 38 in the exposure trajectory information obtaining unit 52. The passage position information is preset based on the installation position of each exposure head 30 with respect to the mounting position of the substrate 12 on the moving stage 14, which is represented by a plurality of vectors or coordinate values of a plurality of points. FIG. 10 is a schematic view illustrating the relationship between a substrate 12 having an ideal shape without subjected to a pressing process or the like, i.e., a substrate 12 without any deformation, such as distortion or the like, with reference marks 12a disposed in the positions indicated by preset reference mark position information 12b and passage position information 12c of a predetermined micro-mirror 38. It is noted that the coordinate system of the passage position information is also the same as that of the exposure points exposed by the micro-mirrors 38. The length of each vector V2 divided by a plurality of reference points 12e (indicated by white circles in FIG. 10) is set equal to that of the reference vector described above.

Figure 11:
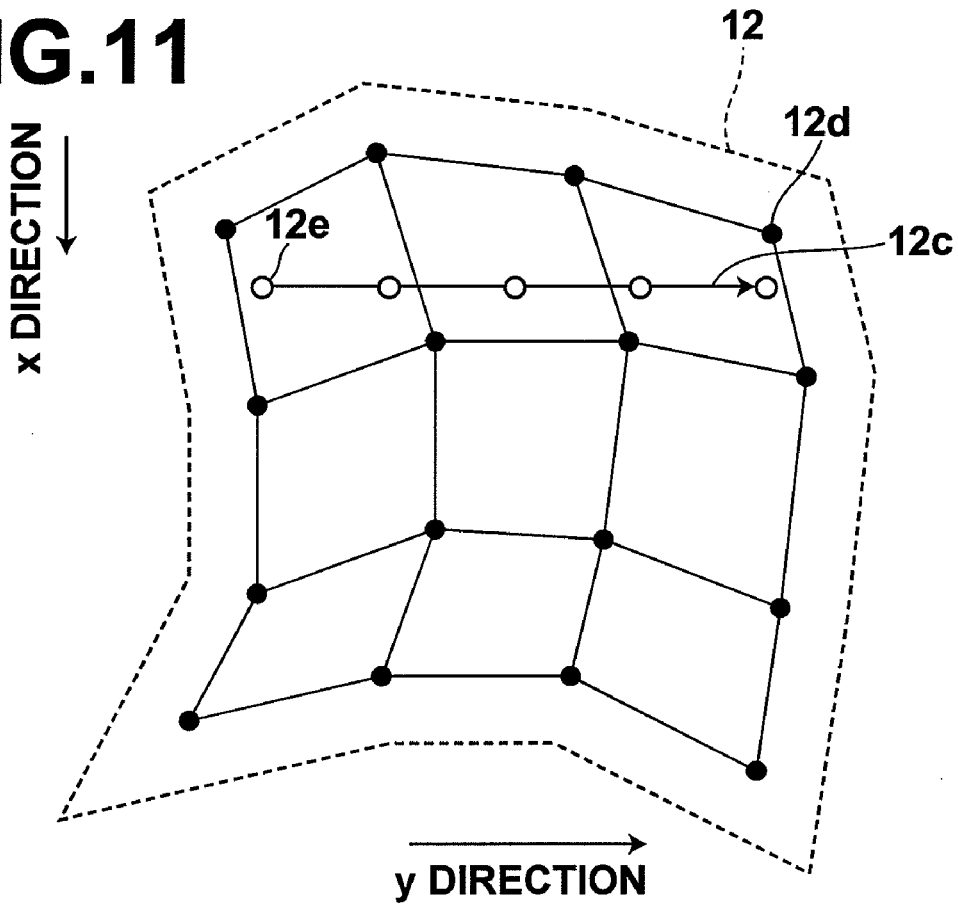
FIG. 11 illustrates a method for obtaining exposure trajectory information of a micro-mirror.
Figure 12:
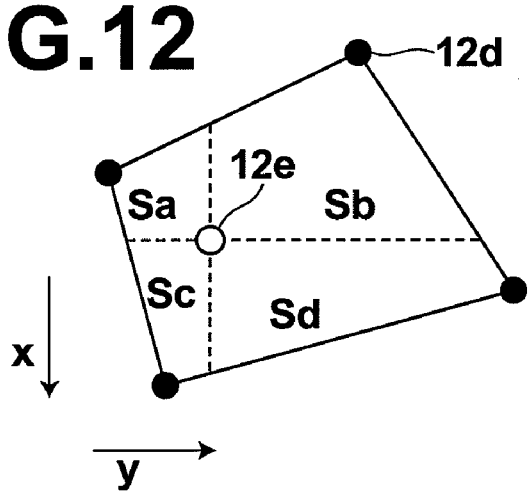
FIG. 12 illustrates a method for obtaining exposure point data trajectory information based on the exposure trajectory information of a micro-mirror.

Then, in the exposure trajectory information obtaining unit 52, the passage position information 12c is associated with detected position information 12d, and a positional relationship with the detected position information 12d is obtained with respect to each reference point 12e in the passage position information 12c, as illustrated in FIG. 11. More specifically, for example, areas of rectangles Sa, Sb, Sc, and Sd determined by the reference point 12e and the detected position information 12d surrounding the reference point 12e are obtained, as illustrated in FIG. 12. Then, areas like those described above are obtained with respect to each reference point 12e and outputted to the exposure point data trajectory information obtaining unit 53 as exposure trajectory information. The exposure trajectory information described above is obtained with respect to the passage position information 12c of each micro-mirror 38 and outputted to the exposure point data trajectory information obtaining unit 53.

Then, based on the exposure trajectory information inputted in the manner as described above, the exposure point data trajectory information obtaining unit 53 obtains exposure point data trajectory information corresponding to the exposure trajectory information.

Figure 13:
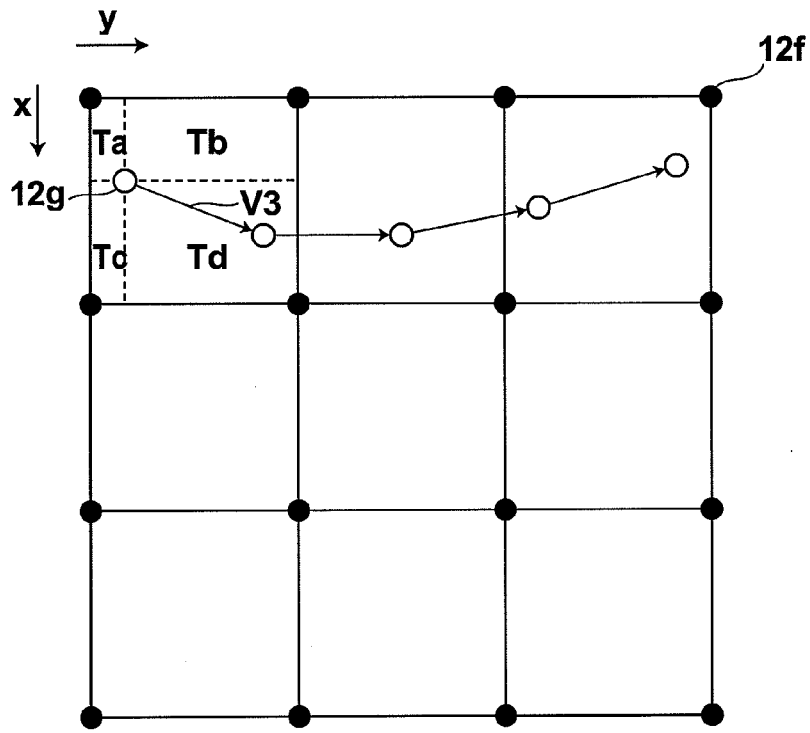
FIG. 13 illustrates a method for obtaining exposure point data trajectory information based on the exposure trajectory information of a micro-mirror.

More specifically, as illustrated in FIG. 13, positional information 12f of the reference marks 12a in the coordinate system of exposure image data is preset in the exposure point data trajectory information obtaining unit 53, and the coordinates of a trace point 12g that satisfies Formula (6) below are obtained with respect to each reference point 12e. Then, as illustrated in FIG. 13, information of a vector V3 connecting the respective trace points 12g is outputted to the exposure point data information obtaining unit 54 as the exposure point data trajectory information.

$$Sa:Sb:Sc:Sd=Ta:Tb:Tc:Td \quad (6)$$

Then, the exposure point data information obtaining unit 54 obtains exposure point data information based on the inputted information of each vector V3.

More specifically, the exposure point data information obtaining unit 54 obtains coordinates of the start and end points of each vector V3, and converts the coordinate values to relative values in the coordinate system of the exposure points in one LCD pixel data, and based on the converted relative coordinate values of the start and end points, obtains a variation amount ($\Delta x$, $\Delta y$) of the end point.

Then, based on the correspondence relationship shown in FIG. 8, the trace data number is obtained for each vector V3.

Figure 14:
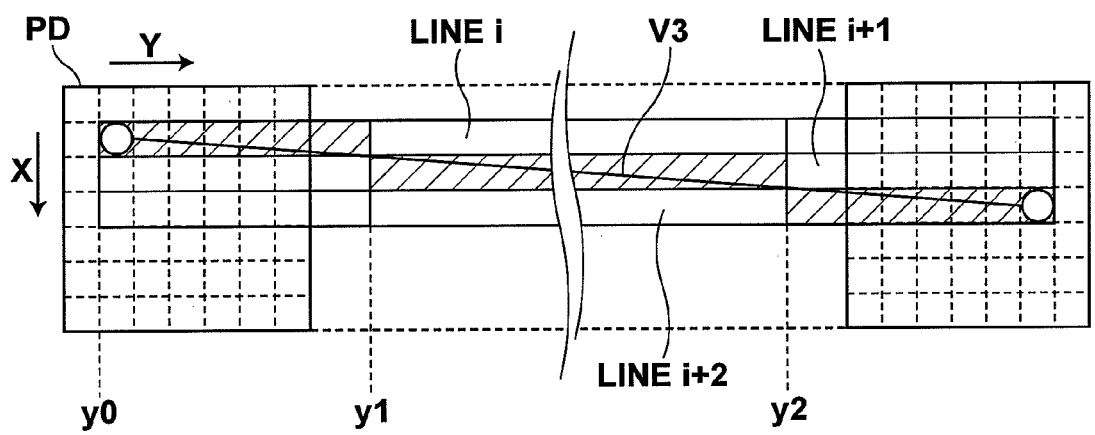
FIG. 14 illustrates a method for selecting trace data corresponding to a vector V3 (exposure point data trajectory information).

More specifically, the trace data number with the coordinate values of the start point and the variation amount ($\Delta x$, $\Delta y$) of the end point corresponding to the vector V3 is obtained. For example, when the vector V3 is a vector like that shown in FIG. 14, the trace data number corresponding to the line "i" is obtained. FIG. 14 associates the coordinate system of the exposure points in LCD pixel data with the vector V3. The line "i" is a line extending in the direction parallel to the "y" direction.

Further, for example, if the $\Delta x$ is +2, the trace data numbers corresponding to the lines i+1 and i+2 are obtained. That is, the trace data numbers having the same y coordinate as the start point y coordinate of the vector V3 and start point x coordinate values corresponding to the values obtained by adding 1 and 2 respectively to the start point x coordinate of the vector V3 with a variation amount $\Delta y$ which is the same as the variation amount $\Delta y$ of the vector V3 are obtained.

Then, with respect to each of the trace data numbers corresponding to the line "i", line "i+1", and line "i+2", trace data readout length and readout position are obtained. The lengths of the slashed portions in the "y" direction in FIG. 14 are readout lengths, and y0, y1, and y2 are the readout positions. The readout length and readout position are determined according to the variation amount ($\Delta x$, $\Delta y$) of the vector V3, and obtained according to a predetermined determination method. The readout position is obtained as the number of bits from the leading bit of the trace data, and the readout length is obtained as the number of bits according to the length of the slashed portion in FIG. 14. In the present embodiment, y0 is always 0, so that it is not necessarily obtained.

Then, based on the each trace data number, readout position, and readout length obtained in the manner as described above, the exposure point data information having a data structure like that shown in FIG. 15.

The exposure point data information includes flags 1 to 3, as illustrated in FIG. 15. Each of the flags 1 to 3 is set to 1 if the trace data number that follows is present and set to 0 if it is not present. In the present embodiment, the readout position y0 is always 0, the readout position y0 is not necessarily included.

Then the exposure point data information like that shown in FIG. 15 is obtained with respect to each vector V3, which is outputted to the exposure point data obtaining unit 56.

The data structure of the exposure point data information is not limited to that shown in FIG. 15 and, for example, for the trace data numbers corresponding to the line "i+1" and line "i+2", may be relative numbers with respect to the trace data number corresponding to the line "i", as illustrated in FIG. 16. For example, if the vector V3 is a vector like that shown in FIG. 14, the relative numbers are +1 and +2. Employment of the data structure shown in FIG. 14 in the exposure point data information may reduce the number of required bits. Here, it is assumed that the trace data numbers are listed serially for the trace data having the same start point x coordinate value and variation amount $\Delta y$.

As described above, in the present embodiment, only the vectors V1 parallel to the "y" direction are set, and the trace data numbers corresponding to the vectors V1 are obtained, so that a single trace data number having the same star point coordinate values and end point variation amount $\Delta y$ as the vector V3 may be identified. For example, where trace data numbers and trace data are obtained by varying the end point of the vector V1 also in the "x" direction, a plurality of trace data numbers having the same start point coordinate values and end point variation amount $\Delta y$ as the vector V3 may exist. Accordingly, where the trace data numbers are obtained by varying the end point of the vector V1 also in the "x" direction, for example, the trace data number having an inclination closest to that of the vector V3 may be identified.

Figure 17:
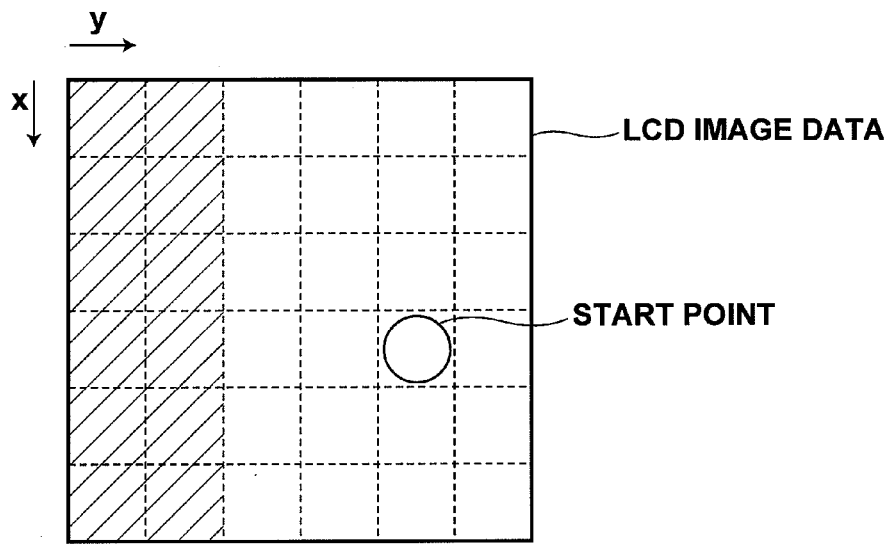
FIG. 17 illustrates another method for selecting trace data corresponding to a vector V3 (exposure point data trajectory information).

Further, in the present embodiment, the position of each of the exposure points within one LCD pixel data is used as the start point "s", and a vector V1 is set with respect to each start point "s" to obtain the trace data. For example, the positions of the start points "s" in the "y" direction may be limited to the slashed sections in FIG. 17 to reduce the number of trace data. It is noted, here, that the trace data have a length corresponding to the length of the extended vector V1t described above.

Where the number of trace data is reduced in the manner as described above, if, for example, the start point coordinates of the vector V3 correspond to the position shown in FIG. 17, the trace data number having the same coordinate values as those of the start point will not exist.

Figure 18:
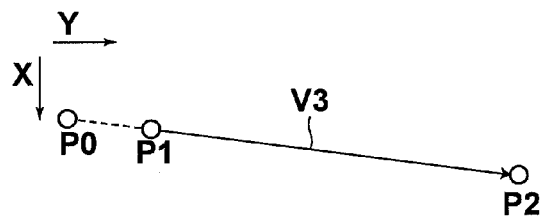
FIG. 18 illustrates still another method for selecting trace data corresponding to a vector V3 (exposure point data trajectory information).
Figure 19:
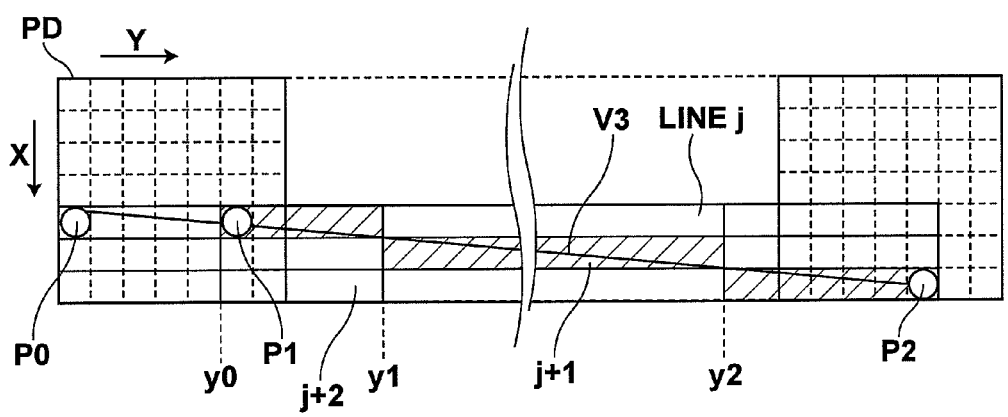
FIG. 19 illustrates a further method for selecting trace data corresponding to a vector V3 (exposure point data trajectory information).

In such a case, for example, a vector V3 with start point P1 and end point P2 is extended on the P1 side, and a start point P0 found in the correspondence relationship shown in FIG. 8 is obtained on the extended line, as illustrated in FIG. 18. Then, the trace data number having the same start point coordinate values as those of the start point P0 with a value of the variation amount $\Delta y$ corresponding to the variation amount $\Delta y$ of the vector V3 is obtained. For example, when the vector V3 is a vector like that shown in FIG. 19, the trace data number corresponding to the line "j" is obtained.

Then, for example, if the Δx is +2, the trace data numbers corresponding to the line "j+1" and line "j+2" are obtained. That is the trace data numbers having the same y coordinate as that of the start point P0 and the start point x coordinate values corresponding to the values obtained by adding 1 and 2 respectively to the x coordinate of the start point P0 with a value of variation amount Δy corresponding to the variation amount Δy of the vector V3.

Then, with respect to each of the trace data numbers corresponding to the line "j", line "j+1", and line "j+2", trace data readout length and readout position are obtained in the same manner as described above.

[Acquisition of Exposure Point Data]

Next, a method for obtaining exposure point data in the display section data based on the exposure point data information of each vector V3 obtained by the exposure point data information obtaining unit 54 in the manner as described above will be described.

First, as described above, the exposure point data obtaining unit 56 includes the template storage unit 56a storing template data like that shown in FIG. 9. When the exposure point data information of each vector V3 is inputted, the exposure point data obtaining unit 56 sequentially decodes the exposure point data information from the top. That is, it obtains the trace data number corresponding to the line "i" first to obtain the readout position y0 and readout length L1. Then, after detecting that the flag is set 1, it reads out the trace data number corresponding to the subsequent line "i+1" to obtain the readout position "y1" and readout length L2. Then, after detecting that the flag is set to 1, it reads out the trace data number corresponding to the subsequent line "i+2" to obtain the readout position "y2" and readout length L3. Thereafter, it recognizes that one exposure point data information is completed by detecting that the flag is set to 0.

Figures 20, 21:
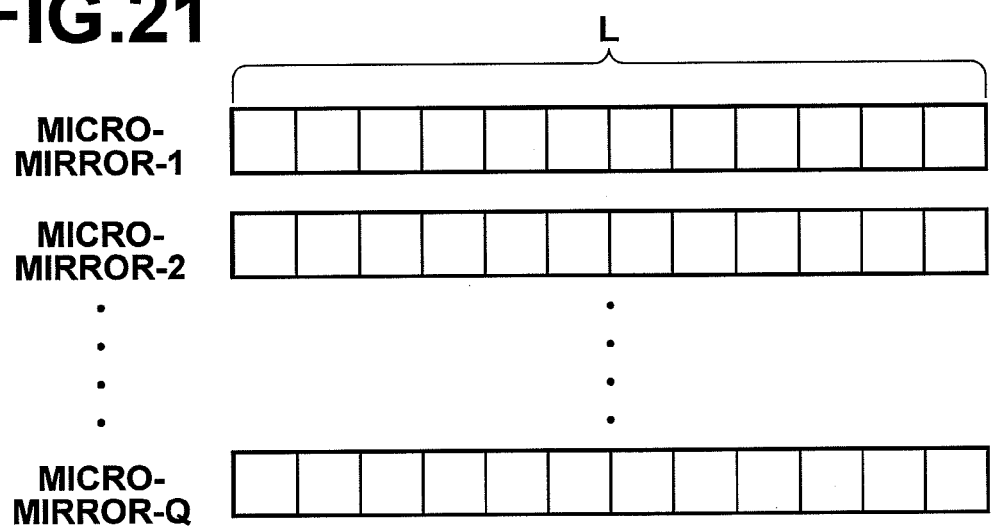
FIG. 20 illustrates correspondence relationship between trace data number and start address.
FIG. 21 illustrates exposure point data string of respective micro-mirrors.

Thereafter, the exposure point data obtaining unit 56 selects trace data of each trace data number in the exposure point data information obtained in the manner as described above, and with respect to the selected trace data, it reads out the trace data from the readout position indicated by the exposure point data information by the amount of the readout length. If the readout position is 0, the trace data are read out from the top. With regard to the relationship between the trace data number and storage area of the trace data, for example, the correspondence relationship between the trace data number and start address of the storage area where the trace data of the trace data number are stored may be preset, as shown in FIG. 20. Based on the readout position in the exposure point data information and the start address described above, the readout start address is obtained, and reading of the exposure point data is initiated from the readout start address.

Then, by connecting together the exposure point data of each trace data read out in the manner as described above, the exposure point data corresponding to the vector V3 are obtained.

By obtaining exposure point data with respect to each vector V3 in the manner as described above and connecting them together, an exposure point data string corresponding to the exposure point data trajectory of a single micro-mirror 38 is obtained.

Then, as in the manner described above, the exposure point data trajectory information with respect to each micro-mirror is obtained based on passage position information and detected position information of each micro-mirror 38, then based on the exposure point data trajectory information of each micro-mirror 38, exposure point data information is obtained, and based on the exposure point data information, trace data are read out and an exposure point data string with respect to each micro-mirror 38 is obtained.

So far, the acquisition of exposure point data from the display section data has been described. Next, a method for obtaining exposure point data in the wiring section data will be described.

As described above, the wiring section data are rasterized and tentatively stored in the image processing unit 50. The wiring section data tentatively stored in the image processing unit 50 are outputted to the sampling data obtaining unit 55. In addition, the exposure point data trajectory information of each micro-mirror 38 is also outputted to the sampling data obtaining unit 55. The sampling data obtaining unit 55 associates each vector V3 of the exposure point data trajectory information with the wiring section data, samples the wiring section data on each vector V3 at a predetermined sampling pitch, and reads out the sampled data as exposure point data. Then, it outputs the exposure point data string with respect to each micro-mirror 38 obtained in the manner as described above to the exposure point data obtaining unit 56. Here, it is assumed that the portion of the wiring section data corresponding to the display section data includes 0 data.

Then, the exposure point data string of each micro-mirror 38 with respect to the display section data obtained by reading out the trace data in the exposure point data obtaining unit 56, and the exposure point data string of each micro-mirror 38 with respect to the wiring section data obtained in the sampling data obtaining unit 56 are combined to generate an exposure point data string of each micro-mirror 38 representing an exposure pattern R of the crystal display. The combination described above is achieved by performing a logical OR operation between the exposure point data string obtained by reading out the trace data based on the exposure point data trajectory information of each micro-mirror 38 and the exposure point data string obtained in the sampling data obtaining unit 56.

[Exposure]

A method for exposing the substrate 12 based on the exposure point data of each micro-mirror 38 obtained in the manner as described above will now be described.

The exposure point data of each micro-mirror 38 obtained in the manner as described above are outputted to the exposure head control unit 58. Then, with the output described above, the moving stage 14 is moved toward upstream again at a desired speed.

Then, when the front edge of the substrate 12 is detected by the cameras 26, the exposure is initiated. More specifically, control signals based on the exposure point data described above are outputted from the exposure head control unit 58 to the DMD 36 of each exposure head 30, and the exposure head 30 exposes the substrate 12 by switching ON/OFF the micro-mirrors of the DMD 36 based on the inputted control signals.

Figure 22:
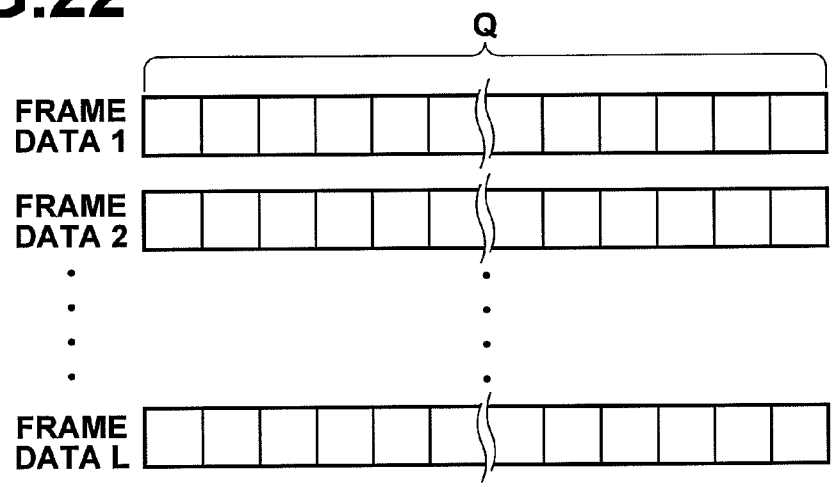
FIG. 22 illustrates respective frame data.

When control signals are outputted from the exposure head control unit 58 to each exposure head 30, control signals corresponding to each position of each exposure head 30 with respect to the substrate 12 are sequentially outputted from the exposure head control unit 58 to each exposure head 30 based on the movement of the moving stage 14. Here, for example, an arrangement may be adopted in which exposure point data depending on each position of each exposure head 30 are sequentially read out one by one from each data string of L exposure point data obtained for each micro-mirror 38 as shown in FIG. 21 and outputted to the DMD 36 of each exposure head 30. Alternatively, as shown in FIG. 22, frame data 1 to L based on each position of each exposure head 30 with respect to the substrate 12 may be generated by rotating the exposure point data obtained in the manner shown in FIG. 21 by 90 degrees or inverting the data using a matrix, and the frame data 1 to L may be sequentially outputted to each exposure head 30.

Then, while the moving stage 14 is moved, the control signals are sequentially outputted to each exposure head 30 to continue the exposure. Thereafter, when the rear edge of the substrate 12 is detected by the cameras 26, the exposure is terminated.

In the above description, the exposure point data obtaining method when exposing a substrate 12 deformed in the pressing process or the like has been explained. But, also when exposing a substrate having an ideal shape without deformation, the exposure point data may be obtained using the identical method. That is, for example, exposure point data trajectory information corresponding to the passage position information preset with respect to each micro-mirror 38 is obtained, then exposure point data information is obtained based on the obtained exposure point data trajectory information, and trace data are read out based on the exposure point data information. In this case, the variation amount ($\Delta x$, $\Delta y$) becomes 0, so that the exposure point data information includes only the trace data numbers having start points with the same coordinate values as those of the start point of the vector V3.

Further, in the embodiment described above, the reference marks 12a on the substrate 12 are detected, and information related to the exposure trajectory of each micro-mirror 38 on the substrate 12 in an actual exposure is obtained based on the detected position information. But the invention is not limited to this. For example, a configuration may be adopted in which a displacement information obtaining means for obtaining displacement information in the direction orthogonal to the moving direction of the moving stage 14 is further provided. Then, information related to the exposure trajectory of each micro-mirror 38 on the substrate 12 in an actual exposure is obtained based on the displacement information obtained by the displacement information obtaining means, then exposure point data trajectory information of vectors V3 is obtained based on the exposure trajectory information, and exposure point data are obtained with respect to each vector V3 in the same manner as described above. The displacement information may be preset in the displacement information obtaining means. As for the displacement measuring method, for example, a measuring method with a laser beam employed in an IC wafer stepper or the like may be used. For example, the amount of displacement may be measured by providing a reflection plane extending in the stage moving direction on the moving stage 14, in addition to a laser light source for irradiating a laser beam toward the reflection plane and a detection unit for detecting reflection light reflected from the reflection plane, and sequentially detecting phase shift of the reflection light by the detection unit.

Further, the exposure trajectory information may be obtained considering also yawing of the moving stage 14.

Still further, the exposure trajectory information may be obtained considering both the detected position information of the reference marks 12a and displacement information.

Figure 23:
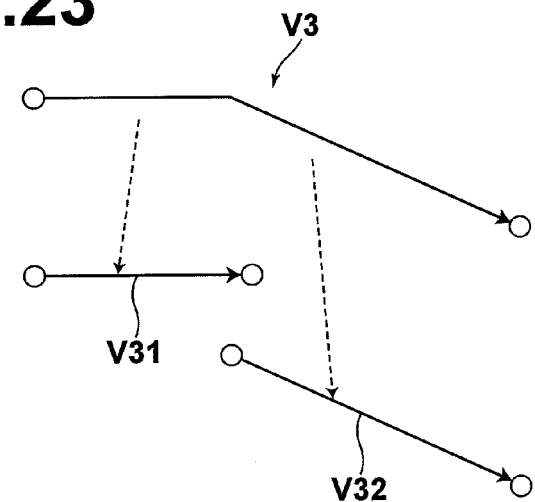
FIG. 23 illustrates a method for obtaining a vector V3 (exposure point data trajectory information) when the exposure trajectory is a curved line or a polygonal line.

Further, the exposure trajectory information may be obtained by a curved line, a polygonal line, or the like. When the exposure trajectory information is obtained by a curved line or a polygonal line, each of the trace points 12g shown in FIG. 13 may be connected by a polygonal line to set a vector V3. Where the vector V3 is obtained by a polygonal line, for example, the vector V3 is divided into two segment vectors V31 and V32 as illustrated in FIG. 23, and exposure point data may be obtained with respect to the segment vectors V31 and V32 in the same manner as described above.

Still further, an arrangement may be adopted in which a speed variation information obtaining means for obtaining speed variation information in advance in the movement of the substrate 12 is further provided, and the exposure point data are obtained by reducing the sampling pitch, pitch_y0 of the reference vector described above such that the density of the exposure point data of a region on the substrate 12 becomes greater where the moving speed of the substrate 12 is slower, based on the speed variation information obtained by the speed variation information obtaining means 90. The speed variation information in the movement of the substrate 12 means the irregularity in the moving speed that occurs according to the control accuracy of the moving mechanism 60 of the moving stage 14.

Further, in the embodiment described above, a method for obtaining exposure point data of display section data in which LCD pixel data PD are repeatedly arranged in the "y" direction using trace data has been discussed. But target original image data for obtaining the exposure point data do not necessarily have the data structure of the display section data. In this case, however, it is necessary to set the vector V1 with the starting point "s" at the position of each of the exposure points in the entire original image data, not only the starting point "s" in one LCD pixel data PD as described above, and to obtain the trace data corresponding to the vector V1. The method for setting the end point "e" of the vector V1 is the same as that described above. Then, when obtaining the trace data corresponding to the vector V3, the coordinates of the starting point "s" and end point "e" of the vector V3 are used as they are, without performing relative conversions on the coordinates of the starting point "s" and end point "e", and the trace data are obtained in the same manner as described above.

Still further, in the embodiment described above, an exposure apparatus including a DMD as the spatial light modulation device has been described. But, a transmission type spatial light modulation device may also be used other than such reflection type spatial light modulation device.

Further, in the embodiment described above, a so-called flatbed type exposure apparatus is described as an example. But, the present invention may also be applied to a so-called outer drum exposure apparatus having a drum on which a photosensitive material is rolled.

Still further, the substrate 12 which is an exposure target of the embodiment described above may be a substrate of a flat panel display other than a printed circuit board. Further, the substrate 12 may be of sheet-like form or continuous length (such as flexible substrate or the like).

Further, the image plotting method and apparatus of the present invention may also be applied to image plotting of an ink-jet printer or the like. For example, an image plot point by ink jetting may be formed in the same manner as the present invention. That is, the image plot point forming area in the present invention may be regarded as an area where an ink discharged from each nozzle is to be attached.

Still further, the image plotting trajectory information in the present invention may be information using the actual image plotting trajectory of an image plot point forming area on a substrate, information of an approximation of the actual image plotting trajectory of an image plot point forming area on a substrate, or information of a prediction of the actual image plotting trajectory of an image plot point forming area on a substrate.

An image pattern to be templated may be a repetitive image pattern or that discretely found a number of times.

Further, an image pattern to be templated may be an image pattern substantially identical to the actual image pattern, though not digitally corresponding to each other. For example, a difference falling within the margin of error at exposure may be disregarded.

Still further, a repetitive image pattern to be templated may be a plurality of different types of image patterns found repetitively. In this case, the template may be created with respect to each type of image pattern, or if regularity is found in the arranged direction of the image patterns, the template may be created with respect to each type of image pattern in the arranged direction.

Further, the exposure target may be a LSI, and, in this case, identical patterns such as memory cells and the like may be templated.

The invention claimed is:

1. An image plotting data obtaining method for obtaining image plotting data used when plotting an image on a substrate by moving an image plot point forming area, which forms an image plot point based on the image plotting data, relative to the substrate and sequentially forming the image plot points on the substrate according to the movement, the method comprising the steps of:

associating information of a plurality of predetermined hypothetical image plotting trajectories of the image plot point forming area on the substrate, the trajectories having different start point positions from each other in the direction orthogonal to the relative moving direction, with original image data representing the image, and obtaining information of a plurality of hypothetical image plot point data trajectories in the original image data, each corresponding to each of the plurality of hypothetical image plotting trajectories;

obtaining hypothetical image plotting data, each corresponding to each of the hypothetical image plot point data trajectories, from the original image data based on the information of plurality of hypothetical image plot point data trajectories;

storing the obtained plurality of hypothetical image plotting data in advance, and setting a correspondence relationship between the hypothetical image plot point data trajectories and the hypothetical image plotting data in advance;

obtaining information of image plotting trajectory of the image plot point forming area on the substrate when the image is plotted;

associating the obtained image plotting trajectory with the original image data, and obtaining information of image plot point data trajectory of the image plot point forming area in the original image data corresponding to the image plotting trajectory;

selecting a plurality of hypothetical image plot point data trajectories corresponding to the obtained image plot point data trajectory from the plurality of hypothetical image plot point data trajectories, and obtaining information indicating the area corresponding to the image plot point data trajectory in each hypothetical image plot point data trajectory indicated by the selected hypothetical image plot point data trajectories;

identifying hypothetical image plotting data corresponding to the selected plurality of hypothetical image plot point data trajectories from the plurality of hypothetical image plotting data stored in advance based on the correspondence relationship;

obtaining partial hypothetical image plotting data from each of the identified hypothetical image plotting data based on the information indicating the area corresponding to the image plot point data trajectory; and obtaining image plotting data corresponding to the image plot point data trajectory based on each of the obtained partial hypothetical image plotting data.

2. The image plotting data obtaining method of claim 1, wherein as the plurality of hypothetical image plotting trajectories, only those parallel to the relative moving direction are set.

3. The image plotting data obtaining method of claim 1, wherein the plurality of hypothetical image plotting trajectories is set with a quantization width coarser than that of the image plotting trajectory on the substrate.

4. The image plotting data obtaining method of claim 2, wherein the plurality of hypothetical image plotting trajectories is set with a quantization width coarser than that of the image plotting trajectory on the substrate.

5. The image plotting data obtaining method of claim 1, wherein if the image plotting trajectory is obtained by a curved line or a polygonal line, the method comprising the steps of:

obtaining the image plot point data trajectory as a plurality of partial image plot point data trajectories corresponding to the curved line or polygonal line;

performing the selection of a plurality of hypothetical image plot point data trajectories with respect to each of the obtained partial image plot point data trajectories, and obtaining information indicating the area corresponding to each of the partial image plot point data trajectories in each hypothetical image plot point data trajectory indicated by the selected hypothetical image plot point data trajectories;

identifying hypothetical image plotting data corresponding to the selected plurality of hypothetical image plotting data trajectories from the plurality of hypothetical image plotting data stored in advance based on the correspondence relationship;

obtaining partial hypothetical image plotting data from each of the identified hypothetical image plotting data based on the information indicating the area corresponding to each of the partial image plot point data trajectories;

obtaining image plotting data corresponding to each of the partial image plot point data trajectories based on each of the obtained partial hypothetical image plotting data; and obtaining image plotting data corresponding to the image plot point data trajectory based on the obtained image plotting data of each of the partial image plot point data trajectories.

6. The image plotting data obtaining method of claim 2, wherein if the image plotting trajectory is obtained by a curved line or a polygonal line, the method comprising the steps of:

obtaining the image plot point data trajectory as a plurality of partial image plot point data trajectories corresponding to the curved line or polygonal line;

performing the selection of a plurality of hypothetical image plot point data trajectories with respect to each of the obtained partial image plot point data trajectories, and obtaining information indicating the area corresponding to each of the partial image plot point data trajectories in each hypothetical image plot point data trajectory indicated by the selected hypothetical image plot point data trajectories;

identifying hypothetical image plotting data corresponding to the selected plurality of hypothetical image plotting data trajectories from the plurality of hypothetical image plotting data stored in advance based on the correspondence relationship;

obtaining partial hypothetical image plotting data from each of the identified hypothetical image plotting data based on the information indicating the area corresponding to each of the partial image plot point data trajectories;

obtaining image plotting data corresponding to each of the partial image plot point data trajectories based on each of the obtained partial hypothetical image plotting data; and obtaining image plotting data corresponding to the image plot point data trajectory based on the obtained image plotting data of each of the partial image plot point data trajectories.

7. The image plotting data obtaining method of claim 3, wherein if the image plotting trajectory is obtained by a curved line or a polygonal line, the method comprising the steps of:

obtaining the image plot point data trajectory as a plurality of partial image plot point data trajectories corresponding to the curved line or polygonal line;

performing the selection of a plurality of hypothetical image plot point data trajectories with respect to each of the obtained partial image plot point data trajectories, and obtaining information indicating the area corresponding to each of the partial image plot point data trajectories in each hypothetical image plot point data trajectory indicated by the selected hypothetical image plot point data trajectories;

identifying hypothetical image plotting data corresponding to the selected plurality of hypothetical image plotting data trajectories from the plurality of hypothetical image plotting data stored in advance based on the correspondence relationship;

obtaining partial hypothetical image plotting data from each of the identified hypothetical image plotting data based on the information indicating the area corresponding to each of the partial image plot point data trajectories;

obtaining image plotting data corresponding to each of the partial image plot point data trajectories based on each of the obtained partial hypothetical image plotting data; and obtaining image plotting data corresponding to the image plot point data trajectory based on the obtained image plotting data of each of the partial image plot point data trajectories.

8. The image plotting data obtaining method of claim 4, wherein if the image plotting trajectory is obtained by a curved line or a polygonal line, the method comprising the steps of:

obtaining the image plot point data trajectory as a plurality of partial image plot point data trajectories corresponding to the curved line or polygonal line;

performing the selection of a plurality of hypothetical image plot point data trajectories with respect to each of the obtained partial image plot point data trajectories, and obtaining information indicating the area corresponding to each of the partial image plot point data trajectories in each hypothetical image plot point data trajectory indicated by the selected hypothetical image plot point data trajectories;

identifying hypothetical image plotting data corresponding to the selected plurality of hypothetical image plotting data trajectories from the plurality of hypothetical image plotting data stored in advance based on the correspondence relationship;

obtaining partial hypothetical image plotting data from each of the identified hypothetical image plotting data based on the information indicating the area corresponding to each of the partial image plot point data trajectories;

obtaining image plotting data corresponding to each of the partial image plot point data trajectories based on each of the obtained partial hypothetical image plotting data; and obtaining image plotting data corresponding to the image plot point data trajectory based on the obtained image plotting data of each of the partial image plot point data trajectories.

9. An image plotting method comprising the steps of:

obtaining image plotting data using the image plotting data obtaining method according to claim 1; and plotting an image on a substrate based on the obtained image plotting data.

10. An image plotting data obtaining apparatus for obtaining image plotting data used when plotting an image on a substrate by moving an image plot point forming area, which forms an image plot point based on the image plotting data, relative to the substrate and sequentially forming the image plot points on the substrate according to the movement, the apparatus comprising:

a hypothetical image plot point data trajectory information obtaining unit for associating information of a plurality of predetermined hypothetical image plotting trajectories of the image plot point forming area on the substrate, the trajectories having different start point positions from each other in the direction orthogonal to the relative moving direction, with original image data representing the image, and obtaining information of a plurality of hypothetical image plot point data trajectories in the original image data, each corresponding to each of the plurality of hypothetical image plotting trajectories;

a hypothetical image plotting data obtaining unit for obtaining hypothetical image plotting data, each corresponding to each of the hypothetical image plot point data trajectories, from the original image data based on the information of plurality of hypothetical image plot point data trajectories obtained by the hypothetical image plot point data trajectory information obtaining unit;

a hypothetical image plotting data storage unit for storing, in advance, the plurality of hypothetical image plotting data obtained by the hypothetical image plotting data obtaining unit;

a correspondence relationship setting unit in which the correspondence relationship between the hypothetical image plot point data trajectories and the hypothetical image plotting data is set in advance;

an image plotting trajectory information obtaining unit for obtaining information of image plotting trajectory of the image plot point forming area on the substrate when the image is plotted;

an image plot point data trajectory information obtaining unit for associating the image plotting trajectory obtained by the image plotting trajectory information obtaining unit with the original image data, and obtaining information of image plot point data trajectory of the image plot point forming area in the original image data corresponding to the image plotting trajectory;

a hypothetical image plot point data trajectory selection unit for selecting a plurality of hypothetical image plot point data trajectories corresponding to the image plot point data trajectory obtained by the image plot point data trajectory information obtaining unit from the plurality of hypothetical image plot point data trajectories obtained by the hypothetical image plot point data trajectory information obtaining unit, and obtaining information indicating the area corresponding to the image plot point data trajectory in each hypothetical image plot point data trajectory indicated by the selected hypothetical image plot point data trajectories; and an image plotting data obtaining unit for identifying hypothetical image plotting data corresponding to the plurality of hypothetical image plotting data trajectories selected by the hypothetical image plot point data trajectory selection unit from the plurality of hypothetical image plotting data stored in advance based on the correspondence relationship, obtaining partial hypothetical image plotting data from each of the identified hypothetical image plotting data based on the information indicating the area corresponding to the image plot point data trajectory, and obtaining image plotting data corresponding to the image plot point data trajectory based on each of the obtained partial hypothetical image plotting data.

11. The image plotting data obtaining apparatus of claim 10, wherein as the plurality of hypothetical image plotting trajectories, only those parallel to the relative moving direction are set.

12. The image plotting data obtaining apparatus of claim 10, wherein the plurality of hypothetical image plotting trajectories is set with a quantization width coarser than that of the image plotting trajectory on the substrate.

13. The image plotting data obtaining apparatus of claim 11, wherein the plurality of hypothetical image plotting trajectories is set with a quantization width coarser than that of the image plotting trajectory on the substrate.

14. The image plotting data obtaining apparatus of claim 10, wherein:

the image plotting trajectory information obtaining unit is a unit for obtaining the image plotting trajectory by a curved line or a polygonal line;

the image plot point data trajectory information obtaining unit is a unit for obtaining the image plot point data trajectory as a plurality of partial image plot point data trajectories corresponding to the curved line or polygonal line;

the hypothetical image plot point data trajectory selection unit is a unit for selecting a plurality of hypothetical image plot point data trajectories with respect to each of the partial image plot point data trajectories obtained by the image plot point data trajectory information obtaining unit, and obtaining information indicating the area corresponding to each of the partial image plot point data trajectories in each hypothetical image plot point data trajectory indicated by the selected hypothetical image plot point data trajectories; and the image plotting data obtaining unit is a unit for identifying hypothetical image plotting data corresponding to the plurality of hypothetical image plotting data trajectories selected by the hypothetical image plot point data trajectory selection unit from the plurality of hypothetical image plotting data stored in advance based on the correspondence relationship, obtaining partial hypothetical image plotting data from each of the identified hypothetical image plotting data based on the information indicating the area corresponding to each of the partial image plot point data trajectories, and obtaining image plotting data corresponding to each of the partial image plot point data trajectories based on each of the obtained partial hypothetical image plotting data.

15. The image plotting data obtaining apparatus of claim 11, wherein:

the image plotting trajectory information obtaining unit is a unit for obtaining the image plotting trajectory by a curved line or a polygonal line;

the image plot point data trajectory information obtaining unit is a unit for obtaining the image plot point data trajectory as a plurality of partial image plot point data trajectories corresponding to the curved line or polygonal line;

the hypothetical image plot point data trajectory selection unit is a unit for selecting a plurality of hypothetical image plot point data trajectories with respect to each of the partial image plot point data trajectories obtained by the image plot point data trajectory information obtaining unit, and obtaining information indicating the area corresponding to each of the partial image plot point data trajectories in each hypothetical image plot point data trajectory indicated by the selected hypothetical image plot point data trajectories; and the image plotting data obtaining unit is a unit for identifying hypothetical image plotting data corresponding to the plurality of hypothetical image plotting data trajectories selected by the hypothetical image plot point data trajectory selection unit from the plurality of hypothetical image plotting data stored in advance based on the correspondence relationship, obtaining partial hypothetical image plotting data from each of the identified hypothetical image plotting data based on the information indicating the area corresponding to each of the partial image plot point data trajectories, and obtaining image plotting data corresponding to each of the partial image plot point data trajectories based on each of the obtained partial hypothetical image plotting data.

16. The image plotting data obtaining apparatus of claim 12, wherein:

the image plotting trajectory information obtaining unit is a unit for obtaining the image plotting trajectory by a curved line or a polygonal line;

the image plot point data trajectory information obtaining unit is a unit for obtaining the image plot point data trajectory as a plurality of partial image plot point data trajectories corresponding to the curved line or polygonal line;

the hypothetical image plot point data trajectory selection unit is a unit for selecting a plurality of hypothetical image plot point data trajectories with respect to each of the partial image plot point data trajectories obtained by the image plot point data trajectory information obtaining unit, and obtaining information indicating the area corresponding to each of the partial image plot point data trajectories in each hypothetical image plot point data trajectory indicated by the selected hypothetical image plot point data trajectories; and the image plotting data obtaining unit is a unit for identifying hypothetical image plotting data corresponding to the plurality of hypothetical image plotting data trajectories selected by the hypothetical image plot point data trajectory selection unit from the plurality of hypothetical image plotting data stored in advance based on the correspondence relationship, obtaining partial hypothetical image plotting data from each of the identified hypothetical image plotting data based on the information indicating the area corresponding to each of the partial image plot point data trajectories, and obtaining image plotting data corresponding to each of the partial image plot point data trajectories based on each of the obtained partial hypothetical image plotting data.

17. The image plotting data obtaining apparatus of claim 13, wherein:
the image plotting trajectory information obtaining unit is a unit for obtaining the image plotting trajectory by a curved line or a polygonal line;
the image plot point data trajectory information obtaining unit is a unit for obtaining the image plot point data trajectory as a plurality of partial image plot point data trajectories corresponding to the curved line or polygonal line;
the hypothetical image plot point data trajectory selection unit is a unit for selecting a plurality of hypothetical image plot point data trajectories with respect to each of the partial image plot point data trajectories obtained by the image plot point data trajectory information obtaining unit, and obtaining information indicating the area corresponding to each of the partial image plot point data trajectories in each hypothetical image plot point data trajectory indicated by the selected hypothetical image plot point data trajectories; and
the image plotting data obtaining unit is a unit for identifying hypothetical image plotting data corresponding to the plurality of hypothetical image plotting data trajectories selected by the hypothetical image plot point data trajectory selection unit from the plurality of hypothetical image plotting data stored in advance based on the correspondence relationship, obtaining partial hypothetical image plotting data from each of the identified hypothetical image plotting data based on the information indicating the area corresponding to each of the partial image plot point data trajectories, and obtaining image plotting data corresponding to each of the partial image plot point data trajectories based on each of the obtained partial hypothetical image plotting data.

18. An image plotting apparatus comprising:
the image plotting data obtaining apparatus according to claim 10; and
an image plotting means for plotting an image on a substrate based on image data obtained by the image plotting data obtaining apparatus.

* * * * *